US012690339B2

(12) United States Patent
Sun et al.

(10) Patent No.: US 12,690,339 B2
(45) Date of Patent: Jul. 21, 2026

(54) DISPLAY PANEL AND DISPLAY APPARATUS

(71) Applicant: BOE Technology Group Co., Ltd., Beijing (CN)

(72) Inventors: Xuefei Sun, Beijing (CN); Jaegeon You, Beijing (CN); Qian Jia, Beijing (CN); Yingtao Wang, Beijing (CN); Tingting Zhou, Beijing (CN); Xinxing Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 432 days.

(21) Appl. No.: 18/546,687

(22) PCT Filed: Mar. 31, 2023

(86) PCT No.: PCT/CN2023/085327
§ 371 (c)(1),
(2) Date: Aug. 16, 2023

(87) PCT Pub. No.: WO2024/113572
PCT Pub. Date: Jun. 6, 2024

(65) Prior Publication Data
US 2025/0017047 A1    Jan. 9, 2025

(30) Foreign Application Priority Data

Nov. 29, 2022    (WO) ................ PCT/CN2022/135100

(51) Int. Cl.
*H10K 59/80*    (2023.01)
*H10K 59/122*    (2023.01)
*H10K 59/38*    (2023.01)
(52) U.S. Cl.
CPC ........... *H10K 59/122* (2023.02); *H10K 59/38* (2023.02); *H10K 59/879* (2023.02)

(58) Field of Classification Search
CPC ..... H10K 59/122; H10K 59/38; H10K 59/879
See application file for complete search history.

(56) References Cited

U.S. PATENT DOCUMENTS

2009/0020838 A1    1/2009  Lin et al.
2019/0162884 A1 *   5/2019  Dong ................ G02F 1/133512
(Continued)

FOREIGN PATENT DOCUMENTS

CN        207116483 U        3/2018
CN        110783375 A        2/2020
(Continued)

OTHER PUBLICATIONS

English Machine Translation of Guo et al , Chinese Pub. No. CN-114628405-A (Year: 2025).*
(Continued)

*Primary Examiner* — Donald L Raleigh
(74) *Attorney, Agent, or Firm* — Intellectual Valley Law, P.C.

(57) ABSTRACT

A display panel is provided. The display panel includes a base substrate; a separation structure on the base substrate; a recess extending into the separation structure; a color filter on a side of the separation structure away from the base substrate; and a lens layer including a plurality of lenses and on a side of the color filter away from the base substrate. An orthographic projection of a respective lens on the base substrate partially overlaps with an orthographic projection of the separation structure on the base substrate. The recess includes a first recess portion and a second recess portion connected with each other. In plan view of the display panel, a gap between two adjacent lenses of the plurality of subpixels is in a region at least partially overlapping with a region having both the first recess portion and the second recess portion.

19 Claims, 17 Drawing Sheets

(56)                    References Cited

U.S. PATENT DOCUMENTS

| | | |
|---|---|---|
| 2019/0363107 A1 | 11/2019 | Matsusaki et al. |
| 2019/0379006 A1 | 12/2019 | Lim et al. |
| 2020/0044177 A1 | 2/2020 | Kim et al. |
| 2020/0357854 A1 | 11/2020 | Koshihara |
| 2021/0193763 A1 | 6/2021 | Sun et al. |
| 2021/0343803 A1 | 11/2021 | Cheng et al. |
| 2022/0115629 A1 | 4/2022 | Suzuki et al. |
| 2022/0158137 A1 | 5/2022 | Chen |
| 2023/0086115 A1 * | 3/2023 | Takagi ................. H10K 50/858 257/40 |
| 2024/0206234 A1 * | 6/2024 | Guo ..................... H10K 59/124 |

FOREIGN PATENT DOCUMENTS

| | | | | |
|---|---|---|---|---|
| CN | 111223904 A | 6/2020 | | |
| CN | 111916480 A | 11/2020 | | |
| CN | 112054161 A | 12/2020 | | |
| CN | 112420959 A | 2/2021 | | |
| CN | 113991041 A | 1/2022 | | |
| CN | 114039008 A | 2/2022 | | |
| CN | 114628405 A | * | 6/2022 | ............. H10D 86/60 |
| JP | 2004039500 A | | 2/2004 | |
| JP | 2006205364 A | | 8/2006 | |
| KR | 20200072745 A | | 6/2020 | |
| WO | WO-2021176882 A1 | * | 9/2021 | ............. G02B 5/201 |

OTHER PUBLICATIONS

English Machine Translation of Takagi , WIPO Pub. No. WO 2021/176882 (Year: 2025).*

International Search Report & Written Opinion mailed Jul. 25, 2023, regarding PCT/CN2023/085327.

Hosokawa et al, "Organic multicolor electroluminescence display with fine pixels", Synthetic Metals 91 (1997) pp. 3-7.

Qi et al., "Study of Wall Technology on OLED", Laser & Infrared, vol. 37, No. 6, Jun. 2007.

The Extended European Search Report in the European Patent Application No. 23895740.1, dated May 30, 2025.

* cited by examiner

SR

A◄   · ·   ►A'

ISR

OP

OP

DISPLAY PANEL AND DISPLAY APPARATUS

CROSS-REFERENCE TO RELATED APPLICATION

This application is a national stage application under 35 U.S.C. § 371 of International Application No. PCT/CN2023/085327, filed Mar. 31, 2023, which is a continuation-in-part of International Application No. PCT/CN2022/135100, filed Nov. 29, 2022. Each of the forgoing applications is herein incorporated by reference in its entirety for all purposes.

TECHNICAL FIELD

The present invention relates to display technology, more particularly, to a display panel and a display apparatus.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD apparatus. An OLED display apparatus typically includes an anode, an organic layer including a light emitting layer, and a cathode. OLEDs can be either a bottom-emission type OLED or a top-emission type OLED.

SUMMARY

In one aspect, the present disclosure provides a display panel, comprising a base substrate; a separation structure on the base substrate; a recess extending into the separation structure; a color filter comprising a plurality of color filter blocks on a side of the separation structure away from the base substrate; and a lens layer comprising a plurality of lenses on a side of the color filter away from the base substrate; wherein an orthographic projection of a respective lens of the plurality of lenses on the base substrate partially overlaps with an orthographic projection of the separation structure on the base substrate; the recess comprises a first recess portion and a second recess portion connected with each other; the first recess portion is on a side of the second recess portion away from the base substrate; and in plan view of the display panel, a gap between two adjacent lenses of the plurality of subpixels is in a region at least partially overlapping with a region having both the first recess portion and the second recess portion.

Optionally, in the cross-section along the plane perpendicular to the base substrate and intersecting the separation structure and the plurality of lenses in a plurality of subpixels, a first adjacent lens and a second adjacent lens of the plurality of lenses are spaced apart from each other by a distance less than the width of the first recess portion.

Optionally, the separation structure comprises a first portion, a second portion, a third portion, a fourth portion, and a fifth portion; the first portion connects the second portion and the third portion; the second portion connects the first portion and the fourth portion; the third portion connects the first portion and the fifth portion; the second portion and the third portion are spaced apart by the second recess portion; and the fourth portion and the fifth portion are spaced apart by the first recess portion.

Optionally, an orthographic projection of a first adjacent lens of the plurality of lenses on the base substrate covers an orthographic projection of the fourth portion on the base substrate; and an orthographic projection of a second adjacent lens of the plurality of lenses on the base substrate covers an orthographic projection of the fifth portion on the base substrate.

Optionally, a part of the first portion in a region having the first recess portion protrudes toward the first recess portion; the first portion has a non-uniform thickness; a center part of the first portion has a thickness greater than a thickness of a peripheral part of the first portion; and the protrusion of the first portion comprises a residual organic material deposited during a process of forming a common layer using an open mask.

Optionally, the color filter comprises an overlapping portion; the overlapping portion comprises a stacked structure comprising a portion of a first adjacent color filter block and a portion of a second adjacent color filter block.

Optionally, the orthographic projection of the separation structure on the base substrate at least partially overlaps with an orthographic projection of the overlapping portion on the base substrate.

Optionally, the orthographic projection of the separation structure on the base substrate covers the orthographic projection of the overlapping portion on the base substrate.

Optionally, an orthographic projection of the plurality of lenses on the base substrate is non-overlapping with an orthographic projection of the overlapping portion on the base substrate.

Optionally, in the cross-section along the plane perpendicular to the base substrate and intersecting the separation structure and the plurality of lenses in a plurality of subpixels, the overlapping portion has a first width, a first adjacent lens and a second adjacent lens of the plurality of lenses are spaced apart from each other by a distance greater than the first width.

Optionally, the width of the first recess portion is greater than the distance.

Optionally, the respective lens comprises a first lens portion and a second lens portion; the first lens portion has a partial spherical shape; the second lens portion has a cylindrical shape; and the first lens portion is on a side of the second lens portion away from the base substrate.

Optionally, in the cross-section along the plane perpendicular to the base substrate and intersecting the separation structure and the plurality of lenses in a plurality of subpixels, the first recess portion has a rectangular shape, and the second recess portion has a rectangular shape.

Optionally, in the cross-section along the plane perpendicular to the base substrate and intersecting the separation structure and the plurality of lenses in a plurality of subpixels, the fourth portion has a non-rectangular shape, and the fifth portion has non-rectangular shape.

Optionally, a shape of the fourth portion comprises a rectangular portion and a triangular portion connected together, the triangular portion being on a side of the rectangular portion away from the second portion, the rectangular portion connecting the triangular portion to the second portion; and a shape of the fifth portion comprises a rectangular portion and a triangular portion connected together, the triangular portion being on a side of the rectangular portion away from the third portion, the rectangular portion connecting the triangular portion to the third portion.

Optionally, a shape of the fourth portion comprises a first rectangular portion and a second rectangular portion connected together, the second rectangular portion being on a side of the first rectangular portion away from the second portion, the first rectangular portion connecting the second rectangular portion to the second portion; and a shape of the fifth portion comprises a first rectangular portion and a second rectangular portion connected together, the second rectangular portion being on a side of the first rectangular portion away from the third portion, the first rectangular portion connecting the second rectangular portion to the third portion.

Optionally, in the cross-section along the plane perpendicular to the base substrate and intersecting the separation structure and the plurality of lenses in a plurality of subpixels, a first adjacent lens and a second adjacent lens of the plurality of lenses are spaced apart from each other by a distance greater than the width of the first recess portion.

Optionally, an orthographic projection of the fourth portion on the base substrate is partially non-overlapping with an orthographic projection of a first adjacent lens of the plurality of lenses on the base substrate; and an orthographic projection of the fifth portion on the base substrate is partially non-overlapping with an orthographic projection of a second adjacent lens of the plurality of lenses on the base substrate.

Optionally, the respective lens comprises a first lens portion and a second lens portion; the first lens portion has a partial spherical shape; the second lens portion has a cylindrical shape; and the first lens portion is on a side of the second lens portion away from the base substrate.

Optionally, the color filter comprises an overlapping portion; the overlapping portion comprises a stacked structure comprising a portion of a first adjacent color filter block and a portion of a second adjacent color filter block; in the cross-section along the plane perpendicular to the base substrate and intersecting the separation structure and the plurality of lenses in a plurality of subpixels, the overlapping portion has a first width less than the distance.

Optionally, in a cross-section along a plane perpendicular to the base substrate and intersecting the separation structure and the plurality of lenses in a plurality of subpixels, a first central line of the overlapping portion and a second central line of the first recess portion and/or the second recess portion are non-overlapping.

Optionally, in the cross-section along a plane perpendicular to the base substrate and intersecting the separation structure and the plurality of lenses in a plurality of subpixels, along a gap spacing apart the first adjacent lens and the second adjacent lens, the first adjacent lens has a first edge, the second adjacent lens has a second edge; a first shortest distance between the first edge and the second central line is greater than a second shortest distance between the second edge and the second central line; a third shortest distance between the first edge and the first central line is greater than a fourth shortest distance between the second edge and the first central line; the third shortest distance is greater than the first shortest distance; and the second shortest distance is greater than the fourth shortest distance.

In another aspect, the present disclosure provides a display apparatus, comprising the display panel described herein, and one or more integrated circuits connected to the display panel.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display panel and a display apparatus that substantially obviate one or more of the problems due to limitations and disadvantages of the related art. In one aspect, the present disclosure provides a display panel. In some embodiments, the display panel includes a base substrate; a separation structure on the base substrate; a recess extending into the separation structure; a color filter comprising a plurality of color filter blocks and on a side of the separation structure away from the base substrate; and a lens layer comprising a plurality of lenses and on a side of the color filter away from the base substrate. Optionally, an orthographic projection of a respective lens of the plurality of lenses on the base substrate partially overlaps with an orthographic projection of the separation structure on the base substrate. Optionally, the recess comprises a first recess portion and a second recess portion connected with each other. Optionally, the first recess portion is on a side of the second recess portion away from the base substrate. Optionally, in plan view of the display panel, a gap between two adjacent lenses of the plurality of subpixels is in a region at least partially overlapping with a region having both the first recess portion and the second recess portion.

Figure 1:
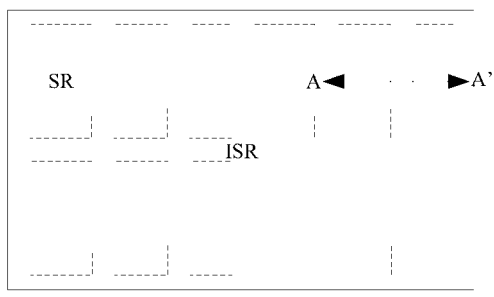
FIG. 1 is a schematic diagram illustrating the structure of a display panel in some embodiments according to the present disclosure.

FIG. 1 is a schematic diagram illustrating the structure of a display panel in some embodiments according to the present disclosure. Referring to FIG. 1, the display panel in some embodiments includes a plurality of subpixel region SR and an inter-subpixel region ISR. As used herein, a subpixel region refers to a light emission region of a subpixel, such as a region corresponding to a pixel electrode in a liquid crystal display, or a region corresponding to a light emissive layer in a light emitting diode display panel, or a region corresponding to a lens in a display panel according to the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a black matrix in a liquid crystal display, or a region corresponding a pixel definition layer in a light emitting diode display panel, or a region corresponding to a gap spacing apart adjacent lenses in a display panel according to the present disclosure. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

Figure 2:
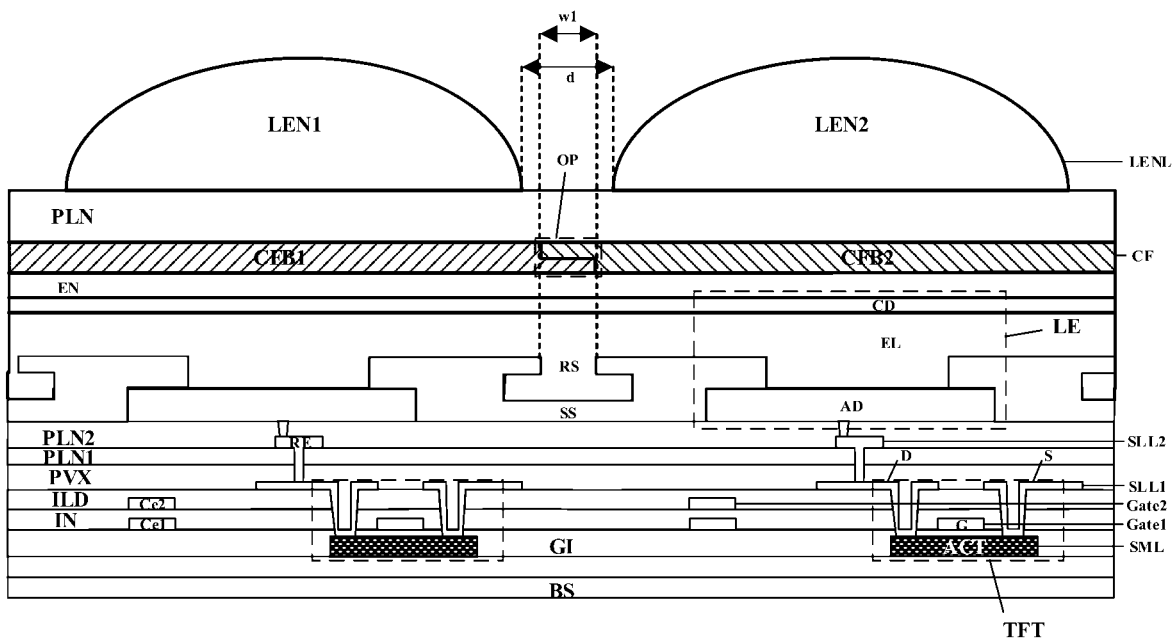
FIG. 2 is a cross-sectional view along an A-A' line in FIG. 1.

FIG. 2 is a cross-sectional view along an A-A' line in FIG. 1. Referring to FIG. 2, the display panel in some embodiments includes a base substrate BS; an active layer ACT of a respective one of a plurality of thin film transistors TFT on the base substrate BS; a gate insulating layer GI on a side of the active layer ACT away from the base substrate BS; a gate electrode G and a first capacitor electrode Ce1 (both are parts of a first gate metal layer Gate1) on a side of the gate insulating layer GI away from the base substrate BS; an insulating layer IN on a side of the gate electrode G and the first capacitor electrode Ce1 away from the gate insulating layer GI; a second capacitor electrode Ce2 (a part of a second gate metal layer Gate2) on a side of the insulating layer IN away from the gate insulating layer GI; an inter-layer dielectric layer ILD on a side of the second capacitor electrode Ce2 away from the gate insulating layer GI; a source electrode S and a drain electrode D (parts of a first signal line layer SLL1) on a side of the inter-layer dielectric layer ILD away from the gate insulating layer GI; a passivation layer PVX on a side of the source electrode S and the drain electrode D away from the inter-layer dielectric layer ILD; a first planarization layer PLN1 on a side of the passivation layer PVX away from the inter-layer dielectric layer ILD; a relay electrode RE (part of a second signal line layer SLL2) on side of the first planarization layer PLN1 away from the passivation layer PVX; a second planarization layer PLN2 on a side of the relay electrode RE away from the first planarization layer PLN1; a separation structure SS on a side of the second planarization layer PLN2 away from the base substrate BS; and a light emitting element LE in the subpixel aperture. The light emitting element LE includes an anode AD on a side of the second planarization layer PLN2 away from the first planarization layer PLN1; a light emitting layer EL on a side of the anode AD away from the second planarization layer PLN2; and a cathode layer CD on a side of the light emitting layer EL away from the anode AD. The display panel further includes an encapsulating layer EN encapsulating the light emitting element LE, and on a side of the cathode layer CD away from the base substrate BS.

Examples of appropriate light emitting elements include organic light emitting diodes, quantum dots light emitting diodes, and micro light emitting diodes. Examples of appropriate light emitting layers include an organic light emitting layer, a quantum dots light emitting layer, and a micro light emitting layer. Optionally, the light emitting element is micro light emitting diode. Optionally, the light emitting element is an organic light emitting diode including an organic light emitting layer. Optionally, the light emitting element is a quantum dots light emitting diode including a quantum dots light emitting layer.

In some embodiments, the display panel includes a semiconductor material layer SML, a first gate metal layer Gate1, a second gate metal layer Gate2, a first signal line layer SLL1, and a second signal line layer SLL2. The display panel further includes an insulating layer IN between the first gate metal layer Gate1 and the second gate metal layer Gate2; an inter-layer dielectric layer ILD between the second gate metal layer Gate2 and the first signal line layer SLL1; and at least a passivation layer PVX or a planarization layer PLN between the first signal line layer SLL1 and the second signal line layer SLL2.

In some embodiments, the display panel further includes a color filter CF on a side of the encapsulating layer EN away from the base substrate BS. The color filter CF includes a plurality of color filter blocks (includes a first adjacent color filter block CFB1 and a second adjacent color filter block CFB2 depicted in FIG. 2). The first adjacent color filter block CFB1 and the second adjacent color filter block CFB2 are two adjacent color filter blocks in two adjacent subpixels. In some embodiments, the display panel further includes a planarization layer PLN on a side of the color filter CF away from the base substrate BS, and a lens layer LENL on a side of the planarization layer PLN away from the base substrate BS. The lens layer LENL includes a plurality of lenses (including a first adjacent lens LEN1 and a second adjacent lens LEN2 depicted in FIG. 2). The first adjacent lens LEN1 and the second adjacent lens LEN2 are two adjacent lens in two adjacent subpixels.

Figure 3:
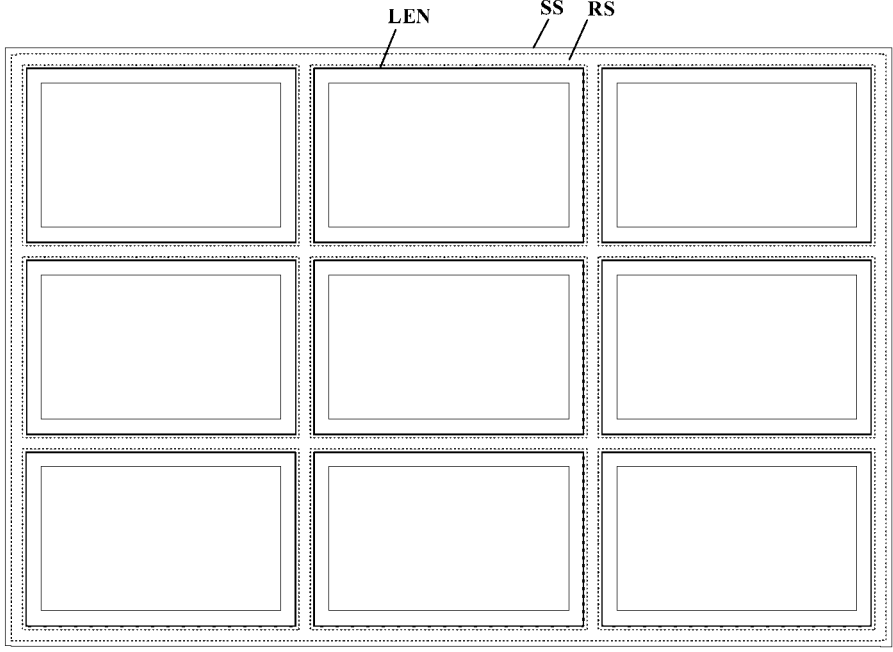
FIG. 3 is a plan view of a lens layer and a separation structure and a recess in some embodiments according to the present disclosure.

FIG. 3 is a plan view of a lens layer and a separation structure and a recess in some embodiments according to the present disclosure. Referring to FIG. 3, the lens layer includes a plurality of lenses LEN. In some embodiments, the display panel includes a recess RS extending into the separation structure SS. Optionally, referring to FIG. 3, the recess RS is a network continuously extending in an inter-subpixel region of the display panel.

In some embodiments, an orthographic projection of a respective lens of the plurality of lenses LEN on a base substrate partially overlaps with an orthographic projection of the separation structure SS on the base substrate. In some embodiments, the separation structure SS is a network continuously extending in a region between adjacent anodes of adjacent subpixels in the display panel. In the example depicted in FIG. 3, an orthographic projection of the plurality of lenses LEN on a base substrate is substantially non-overlapping (e.g., completely non-overlapping) with an orthographic projection of the recess RS on the base substrate. As used herein, the term "substantially non-overlapping" refers to two orthographic projections being at least 50 percent (e.g., at least 60 percent, at least 70 percent, at least 80 percent, at least 90 percent, at least 95 percent, at least 99 percent, and 100 percent) non-overlapping.

Figure 4:
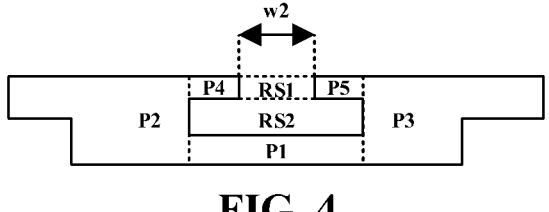
FIG. 4 is a cross-sectional view of a separation structure and a recess in some embodiments according to the present disclosure.

FIG. 4 is a cross-sectional view of a separation structure and a recess in some embodiments according to the present disclosure. Referring to FIG. 2 and FIG. 4, in a cross-section along a plane perpendicular to the base substrate BS and intersecting the separation structure SS and the plurality of lenses in a plurality of subpixels, the recess RS includes a first recess portion RS1 and a second recess portion RS2 connected with each other. The first recess portion RS1 is on a side of the second recess portion RS2 away from the base substrate BS. In the cross-section along the plane perpendicular to the base substrate BS and intersecting the separation structure SS and the plurality of lenses in a plurality of subpixels, the second recess portion RS2 has a width greater than a width of the first recess portion RS1.

Referring to FIG. 2 and FIG. 4, in a cross-section along a plane perpendicular to the base substrate BS and intersecting the separation structure SS and the plurality of lenses in a plurality of subpixels, the separation structure SS includes a first portion P1, a second portion P2, a third portion P3, a fourth portion P4, and a fifth portion P5. The first portion P1 connects the second portion P2 and the third portion P3. The second portion P2 connects the first portion P1 and the fourth portion P4. The third portion P3 connects the first portion P1 and the fifth portion P5. The second portion P2 and the third portion P3 are spaced apart by the second recess portion RS2. The fourth portion P4 and the fifth portion P5 are spaced apart by the first recess portion RS1.

In some embodiments, the second recess portion RS2 is surrounded by the first portion P1, the second portion P2, the third portion P3, the fourth portion P4, the fifth portion P5, and the first recess portion RS1. The first recess portion RS1 is partially surrounded by the fourth portion P4, the fifth portion P5, and the second recess portion RS2. The first recess portion RS1 spaces apart the fourth portion P4 and the fifth portion P5. The second recess portion RS2 spaces apart the second portion P2 and the third portion P3. The second recess portion RS2 spaces apart the first recess portion RS1 and the first portion P1.

In some embodiments, the display panel includes an organic material at least partially in the recess RS including the first recess portion RS1 and the second recess portion RS2. Optionally, the organic material is a residual organic material deposited during a process of forming a common layer using an open mask. Examples of common layers include a hole injection layer, a hole transport layer, an electron injection layer, and an electron transport layer. The separation structure SS at least partially segregates the common layer into discontinuous segments, thereby defining a plurality of subpixels.

In some embodiments, the separation structure SS includes an insulating material.

In some embodiments, in a cross-section along a plane perpendicular to the base substrate BS and intersecting the separation structure SS and the plurality of lenses in a plurality of subpixels, the recess RS has a 1 shape.

In some embodiments, the color filter CF includes an overlapping portion OP. In some embodiments, the overlapping portion OP includes a stacked structure comprising a portion of a first adjacent color filter block CFB1 and a portion of a second adjacent color filter block CFB2. In one example, the portion of the second adjacent color filter block CFB2 is on a side of the portion of the first adjacent color filter block CFB1 away from the base substrate BS. In another example, the portion of the first adjacent color filter block CFB1 is on a side of the portion of the second adjacent color filter block CFB2 away from the base substrate BS. In one example, the first adjacent color filter block CFB1 and the second adjacent color filter block CFB2 are color filter blocks of different colors. In another example, the first adjacent color filter block CFB1 and the second adjacent color filter block CFB2 are color filter blocks of a same color.

In some embodiments, an orthographic projection of the separation structure SS on a base substrate BS at least partially overlaps with an orthographic projection of the overlapping portion OP on the base substrate BS. Optionally, the orthographic projection of the separation structure SS on the base substrate BS covers the orthographic projection of the overlapping portion OP on the base substrate BS.

Figure 5A:
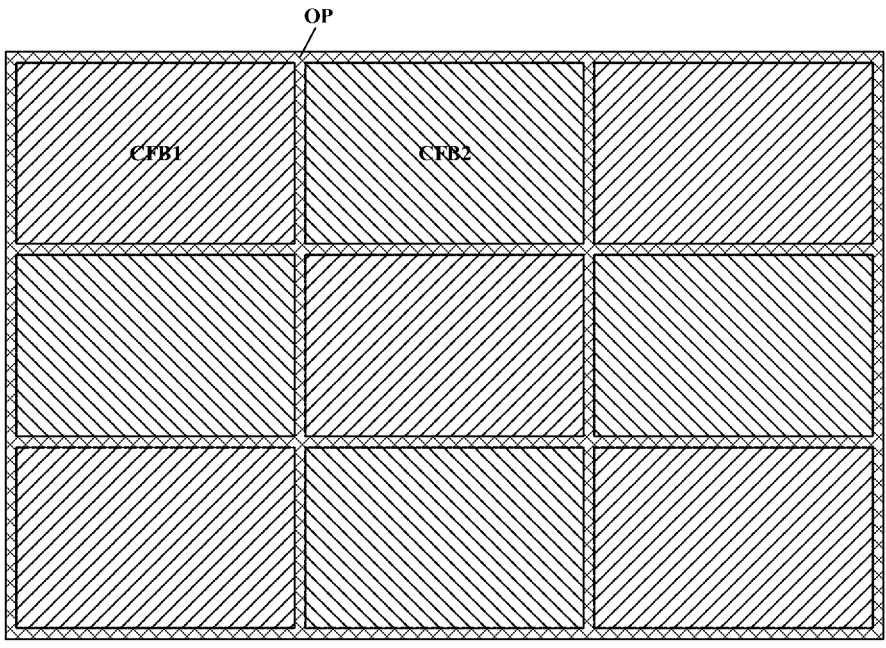
FIG. 5A is a plan view of a color filter in some embodiments according to the present disclosure.

FIG. 5A is a plan view of a color filter in some embodiments according to the present disclosure. Referring to FIG. 5A, the overlapping portion OP in some embodiments is a network continuously extending in an inter-subpixel region of the display panel.

Figure 5B:
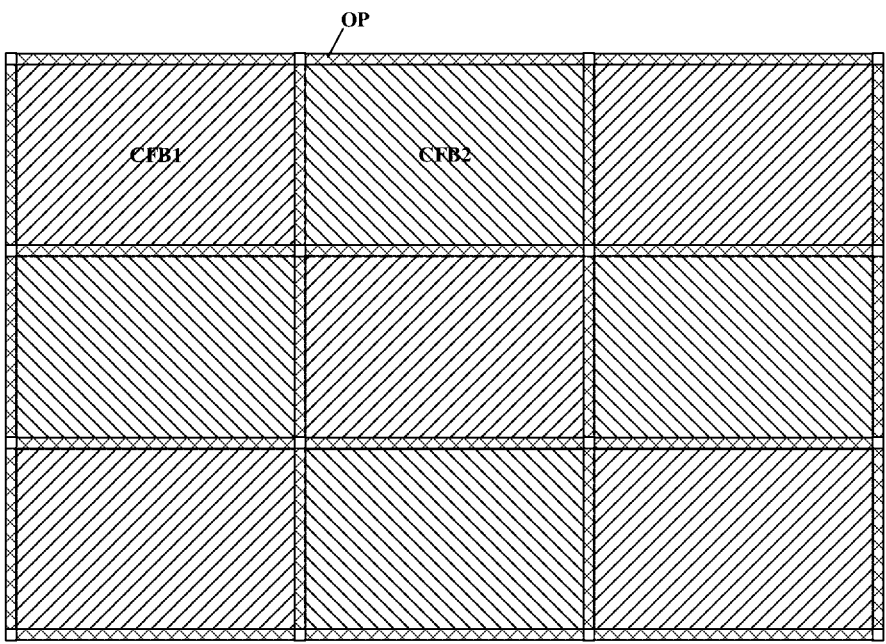
FIG. 5B is a plan view of a color filter in some embodiments according to the present disclosure.

FIG. 5B is a plan view of a color filter in some embodiments according to the present disclosure. Referring to FIG. 5B, the overlapping portion in some embodiments a plurality of parts at least partially segregated from each other. A respective part of the plurality of parts includes a stacked structure comprising a portion of a first adjacent color filter block CFB1 and a portion of a second adjacent color filter block CFB2. The overlapping portion OP is at least partially absent in a region surrounded by four adjacent color filter blocks.

In some embodiments, in a cross-section along a plane perpendicular to the base substrate BS and intersecting the separation structure SS and the plurality of lenses in a plurality of subpixels, the overlapping portion OP has a first width $w1$.

In some embodiments, in a cross-section along a plane perpendicular to the base substrate BS and intersecting the separation structure SS and the plurality of lenses in a plurality of subpixels, the first adjacent lens LEN1 and the second adjacent lens LEN2 are spaced apart from each other by a distance d.

In some embodiments, in a cross-section along a plane perpendicular to the base substrate BS and intersecting the separation structure SS and the plurality of lenses in a plurality of subpixels, the first recess portion RS1 has a second width $w2$.

The inventors of the present disclosure discover that, surprisingly and unexpectedly, the relative positions among the separation structure SS, the adjacent lenses, and the recess RS can significantly affect the display quality. In particular, the inventors of the present disclosure discover that the relative sizes between any two of $w1$, d, and $w2$ can affect the occurrence of light leakage and/or mura defect in the display panel.

Figures 6, 7:
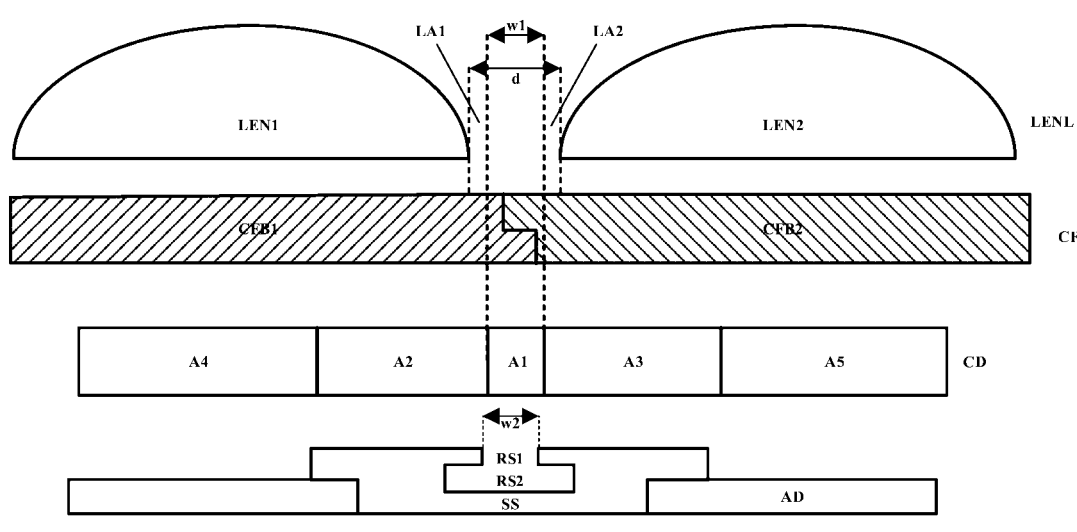
FIG. 6 illustrates a light path in a display panel in some embodiments according to the present disclosure.
FIG. 7 is a cross-sectional view of a display panel in some embodiments according to the present disclosure.

FIG. 6 illustrates a light path in a display panel in some embodiments according to the present disclosure. The light path illustrated in FIG. 6 corresponds to a light path in a display panel having the structure depicted in FIG. 2. The components illustrated in FIG. 6 are schematic representations which may not have the actual shapes of the components. Referring to FIG. 6, the cathode CD has a first region A1, a second region A2, a third region A3, a fourth region A4, and a fifth region A5. The first region A1 corresponds to the first recess portion RS1. Because organic material layers (e.g., any common layer) are segregated due to the presence of the first recess portion RS1, any light emitting material deposited in the recess does not emit light. Accordingly, there is no light leakage in first region A1.

The fourth region A4 and the fifth region A5 correspond to normal light emitting regions of two adjacent subpixels, respectively.

Referring to FIG. 4 and FIG. 6, the second region A2 corresponds to the second portion P2 and the fourth portion P4 of the separation structure SS, the third region A3 corresponds to the third portion P3 and the fifth portion P5 of the separation structure SS. The organic material layers are deposited on the second portion P2, the third portion P3, the fourth portion P4, and the fifth portion P5. In regions corresponding to the second portion P2, the third portion P3, the fourth portion P4, and the fifth portion P5, the anode AD is either absent or spaced apart from the organic material layers by the separation structure SS. Due to horizontal current in the organic material layer, the second region A2 and the third region A3 are prone to light leakage.

Because d is greater than $w1$ and greater than $w2$, a portion of light transmitting through the second region A2 and the third region A3 may emit out of the display panel without passing through the first adjacent lens LEN1 or the second adjacent lens LEN2, for example, emit out of the display panel from the first light leakage area LA1 or the second light leakage area LA2. The inventors of the present disclosure discover that, when an alignment errors occurs in assembly the display panel, mura may be observable in the display panel.

Referring to FIG. 2, FIG. 4, and FIG. 6, in some embodiments, an orthographic projection of the second region A2 on a base substrate BS is at least partially non-overlapping with an orthographic projection of the lens layer LENL on the base substrate BS; and an orthographic projection of the third region A3 on the base substrate BS is at least partially non-overlapping with the orthographic projection of the lens layer LENL on the base substrate BS. Optionally, an orthographic projection of the first region A1 on the base substrate BS is non-overlapping with the orthographic projection of the lens layer LENL on the base substrate BS.

Referring to FIG. 2, FIG. 4, and FIG. 6, in some embodiments, an orthographic projection of the fourth portion P4 on a base substrate BS is at least partially non-overlapping with an orthographic projection of the lens layer LENL on the base substrate BS; and an orthographic projection of the fifth portion P5 on the base substrate BS is at least partially non-overlapping with the orthographic projection of the lens layer LENL on the base substrate BS. Optionally, an orthographic projection of the first recess portion RS1 on the base substrate BS is non-overlapping with the orthographic projection of the lens layer LENL on the base substrate BS.

Figure 8:
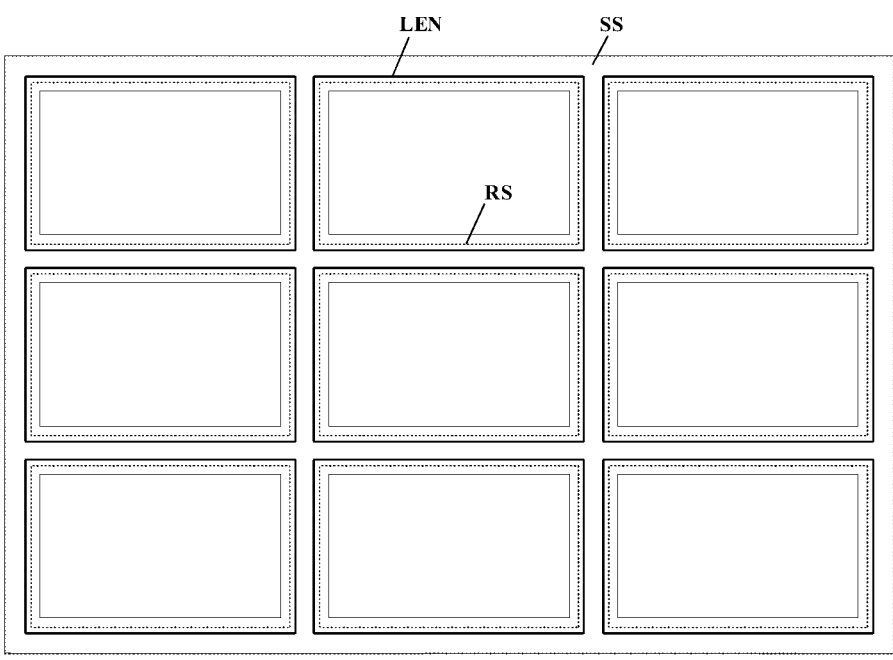
FIG. 8 is a plan view of a lens layer and a separation structure and a recess in some embodiments according to the present disclosure.

FIG. 7 is a cross-sectional view of a display panel in some embodiments according to the present disclosure. FIG. 8 is a plan view of a lens layer and a separation structure and a recess in some embodiments according to the present disclosure. Referring to FIG. 7 and FIG. 8, in some embodiments, an orthographic projection of a respective lens of the plurality of lenses LEN on a base substrate BS partially overlaps with an orthographic projection of the separation structure SS on the base substrate BS. In some embodiments, the separation structure SS is a network continuously extending in a region between adjacent anodes of adjacent subpixels in the display panel. In the example depicted in FIG. 7 and FIG. 8, an orthographic projection of the plurality of lenses LEN on a base substrate BS is partially overlapping with an orthographic projection of the recess RS on the base substrate BS.

Figure 9:
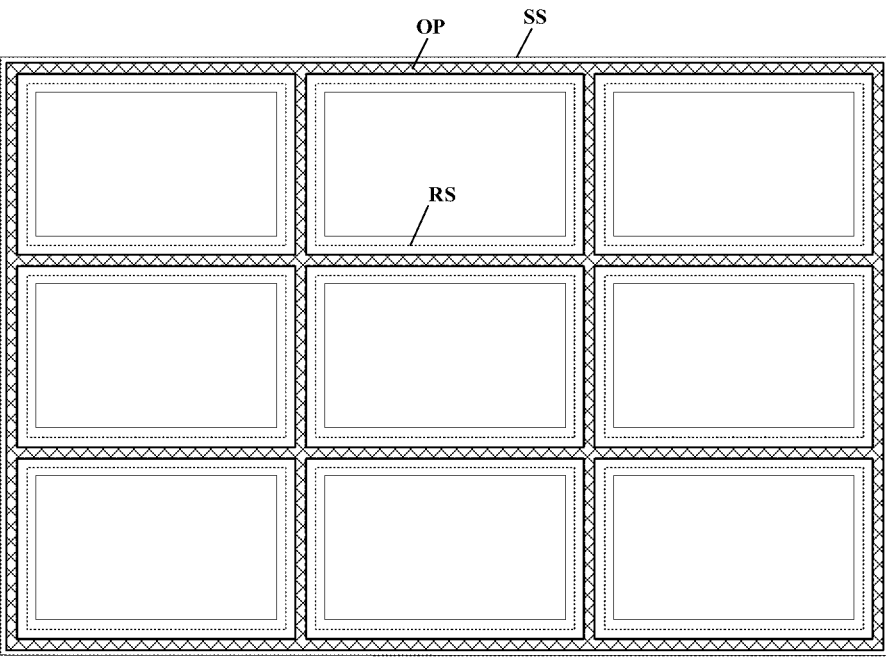
FIG. 9 is a plan view of a lens layer and a separation structure and an overlapping portion in some embodiments according to the present disclosure.

FIG. 9 is a plan view of a lens layer and a separation structure and an overlapping portion in some embodiments according to the present disclosure. FIG. 9 shows an overlapping portion OP in the color filter without showing other portions of the color filter for illustration purpose. Referring to FIG. 7 and FIG. 9, in some embodiments, the overlapping portion OP is a network continuously extending in an inter-subpixel region of the display panel. In some embodiments, an orthographic projection of the separation structure SS on a base substrate BS at least partially overlaps with an orthographic projection of the overlapping portion OP on the base substrate BS. Optionally, the orthographic projection of the separation structure SS on the base substrate BS covers the orthographic projection of the overlapping portion OP on the base substrate BS. In some embodiments, an orthographic projection of the recess RS on a base substrate BS at least partially overlaps with an orthographic projection of the overlapping portion OP on the base substrate BS. Optionally, the orthographic projection of the recess RS on the base substrate BS covers the orthographic projection of the overlapping portion OP on the base substrate BS. In one example, the overlapping portion OP is limited in a region corresponding to the recess RS.

Figure 10:
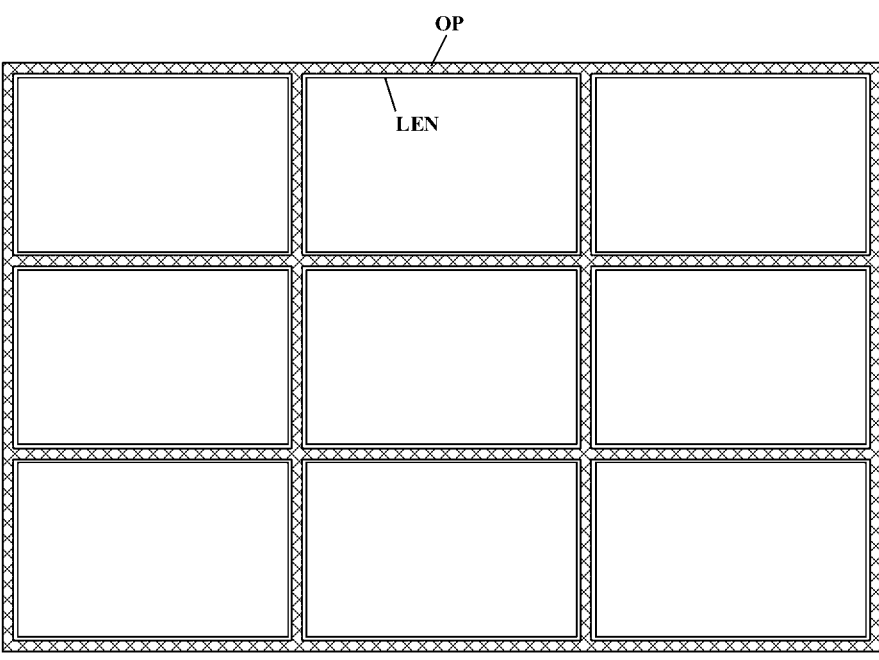
FIG. 10 is a plan view of a lens layer and an overlapping portion in some embodiments according to the present disclosure.

FIG. 10 is a plan view of a lens layer and an overlapping portion in some embodiments according to the present disclosure. FIG. 10 shows an overlapping portion OP in the color filter without showing other portions of the color filter for illustration purpose. Referring to FIG. 7 and FIG. 10, in some embodiments, the lens layer includes a plurality of lenses LEN. In the example depicted in FIG. 7 and FIG. 10, an orthographic projection of the plurality of lenses LEN on a base substrate BS is substantially non-overlapping (e.g., completely non-overlapping) with an orthographic projection of the overlapping portion OP on the base substrate BS.

In some embodiments, the display panel includes a recess RS extending into the separation structure SS. Optionally, referring to FIG. 7, the recess RS is a network continuously extending in an inter-subpixel region of the display panel.

Figure 11A:
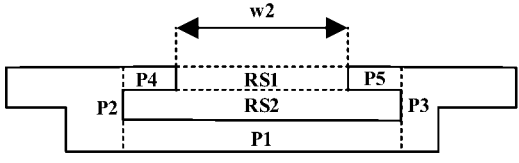
FIG. 11A is a cross-sectional view of a separation structure and a recess in some embodiments according to the present disclosure.

FIG. 11A is a cross-sectional view of a separation structure and a recess in some embodiments according to the present disclosure. Referring to FIG. 7 and FIG. 11A, in a cross-section along a plane perpendicular to the base substrate BS and intersecting the separation structure SS and the plurality of lenses in a plurality of subpixels, the recess RS includes a first recess portion RS1 and a second recess portion RS2 connected with each other. The first recess portion RS1 is on a side of the second recess portion RS2 away from the base substrate BS. In the cross-section along the plane perpendicular to the base substrate BS and intersecting the separation structure SS and the plurality of lenses in a plurality of subpixels, the second recess portion RS2 has a width greater than a width of the first recess portion RS1.

In some embodiments, in plan view of the display panel, a gap between two adjacent lenses of the plurality of subpixels is in a region at least partially overlapping with a region having both the first recess portion and the second recess portion. Optionally, in plan view of the display panel, the gap between two adjacent lenses of the plurality of subpixels is in a region that is entirely in the region having both the first recess portion and the second recess portion.

Referring to FIG. 7 and FIG. 11A, in a cross-section along a plane perpendicular to the base substrate BS and intersecting the separation structure SS and the plurality of lenses in a plurality of subpixels, the separation structure SS includes a first portion P1, a second portion P2, a third portion P3, a fourth portion P4, and a fifth portion P5. The first portion P1 connects the second portion P2 and the third portion P3. The second portion P2 connects the first portion P1 and the fourth portion P4. The third portion P3 connects the first portion P1 and the fifth portion P5. The second portion P2 and the third portion P3 are spaced apart by the second recess portion RS2. The fourth portion P4 and the fifth portion P5 are spaced apart by the first recess portion RS1.

In some embodiments, the second recess portion RS2 is surrounded by the first portion P1, the second portion P2, the third portion P3, the fourth portion P4, the fifth portion P5, and the first recess portion RS1. The first recess portion RS1 is partially surrounded by the fourth portion P4, the fifth portion P5, and the second recess portion RS2. The first recess portion RS1 spaces apart the fourth portion P4 and the fifth portion P5. The second recess portion RS2 spaces apart the second portion P2 and the third portion P3. The second recess portion RS2 spaces apart the first recess portion RS1 and the first portion P1.

In some embodiments, the display panel includes an organic material at least partially in the recess RS including the first recess portion RS1 and the second recess portion RS2. Optionally, the organic material is a residual organic material deposited during a process of forming a common layer using an open mask. Examples of common layers include a hole injection layer, a hole transport layer, an electron injection layer, and an electron transport layer. The separation structure SS at least partially segregates the common layer into discontinuous segments, thereby defining a plurality of subpixels.

Figure 11B:
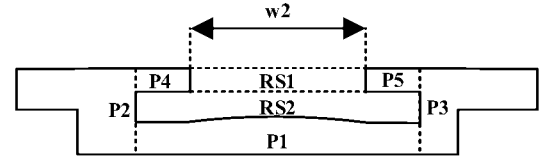
FIG. 11B is a cross-sectional view of a separation structure and a recess in some embodiments according to the present disclosure.

FIG. 11B is a cross-sectional view of a separation structure and a recess in some embodiments according to the present disclosure. Referring to FIG. 7 and FIG. 11B, a part of the first portion P1 in a region having the first recess portion RS1 protrudes toward the first recess portion RS1. Optionally, the first portion P1 has a non-uniform thickness. A center part of the first portion P1 has a thickness greater than a thickness of a peripheral part of the first portion P1. In one example, the protruded part of the first portion P1 includes a residual organic material deposited during a process of forming a common layer using an open mask.

In some embodiments, the separation structure SS includes an insulating material.

In some embodiments, in a cross-section along a plane perpendicular to the base substrate BS and intersecting the separation structure SS and the plurality of lenses in a plurality of subpixels, the recess RS has a 1 shape.

Figure 12:
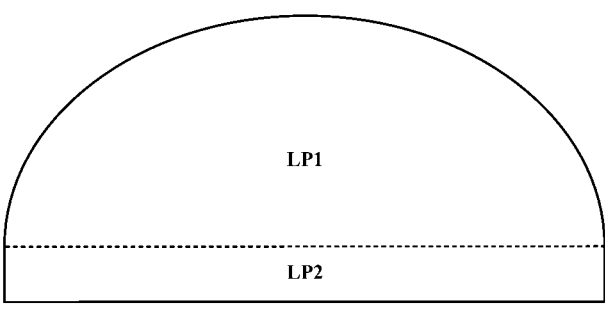
FIG. 12 is a cross-sectional view of a respective lens in some embodiments according to the present disclosure.

FIG. 12 is a cross-sectional view of a respective lens in some embodiments according to the present disclosure. Referring to FIG. 12, in some embodiments, the respective lens includes a first lens portion LP1 and a second lens portion LP2. The first lens portion LP1 has a partial spherical shape, and the second lens portion LP2 has a non-spherical shape, e.g., a shape lacking a spherical or partial spherical surface. In one example, the second lens portion LP2 has a cylindrical shape. In some embodiments, the second lens portion LP2 is on a side of the first lens portion LP1 closer to the base substrate BS. The first lens portion LP1 is on a side of the second lens portion LP2 away from the base substrate BS.

Figure 13:
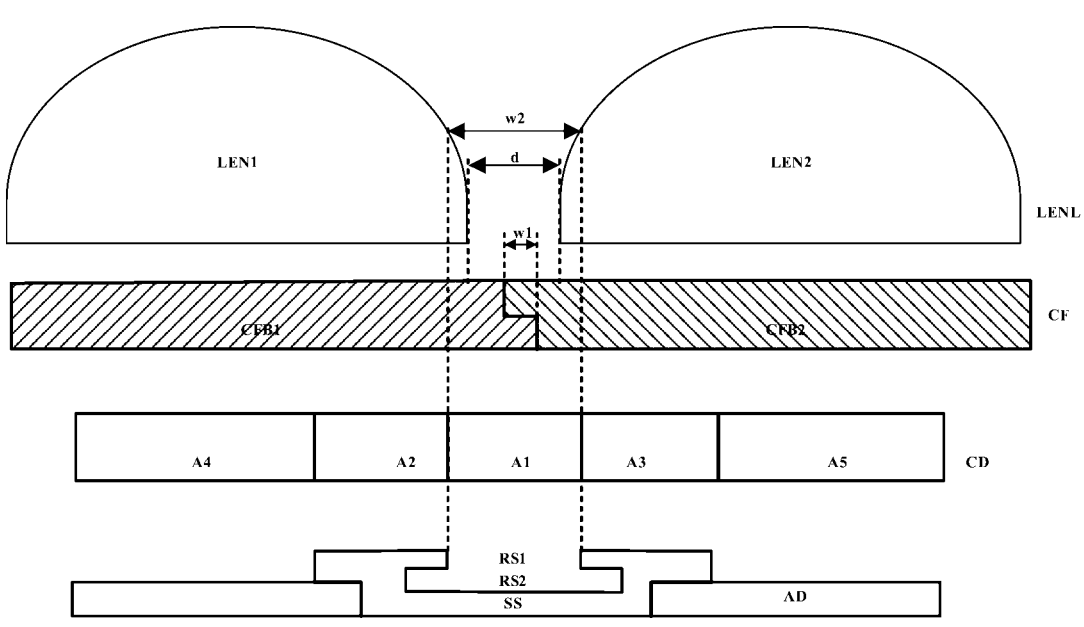
FIG. 13 illustrates a light path in a display panel in some embodiments according to the present disclosure.

FIG. 13 illustrates a light path in a display panel in some embodiments according to the present disclosure. The light path illustrated in FIG. 13 corresponds to a light path in a display panel having the structure depicted in FIG. 7.

Referring to FIG. 13, in some embodiments, in a cross-section along a plane perpendicular to the base substrate BS and intersecting the separation structure SS and the plurality of lenses in a plurality of subpixels, the overlapping portion OP has a first width w1; the first adjacent lens LEN1 and the second adjacent lens LEN2 are spaced apart from each other by a distance d; and the first recess portion RS1 has a second width w2.

Referring to FIG. 13, the cathode CD has a first region A1, a second region A2, a third region A3, a fourth region A4, and a fifth region A5. The first region A1 corresponds to the first recess portion RS1. Because organic material layers (e.g., any common layer) are segregated due to the presence of the first recess portion RS1, any light emitting material deposited in the recess does not emit light. Accordingly, there is no light leakage in first region A1.

The fourth region A4 and the fifth region A5 correspond to normal light emitting regions of two adjacent subpixels, respectively.

Referring to FIG. 11A, FIG. 11B and FIG. 13, the second region A2 corresponds to the second portion P2 and the fourth portion P4 of the separation structure SS, the third region A3 corresponds to the third portion P3 and the fifth portion P5 of the separation structure SS. The organic material layers are deposited on the second portion P2, the third portion P3, the fourth portion P4, and the fifth portion P5. In regions corresponding to the second portion P2, the third portion P3, the fourth portion P4, and the fifth portion P5, the anode AD is either absent or spaced apart from the organic material layers by the separation structure SS. Due to horizontal current in the organic material layer, the second region A2 and the third region A3 are prone to light leakage.

In some embodiments, d is greater than w1. The inventors of the present disclosure discover that, by having d greater than w1, color crosstalk between adjacent subpixels can be reduced or obviated.

In some embodiments, w2 is greater than d. The inventors of the present disclosure discover that, by having w2 greater than d, light leakage in the region between adjacent lenses (e.g., LEN1 and LEN2) can be reduced or obviated. Comparing FIG. 13 with FIG. 6, the first light leakage area LA1 or the second light leakage area LA2 depicted in FIG. 6 is not present in FIG. 13. Referring to FIG. 7, FIG. 11A, FIG. 11B, and FIG. 13, in some embodiments, an orthographic projection of the first adjacent lens LEN1 on a base substrate BS covers an orthographic projection of the second region A2 on the base substrate BS; and an orthographic projection of the second adjacent lens LEN2 on the base substrate BS covers an orthographic projection of the third region A3 on the base substrate BS. Optionally, an orthographic projection of the first region A1 on the base substrate BS is partially overlapping with the orthographic projection of the lens layer LENL on the base substrate BS. In one example, the orthographic projection of the first region A1 on the base substrate BS is partially overlapping with the orthographic projection of the first adjacent lens LEN1 on the base substrate BS, and partially overlapping with the orthographic projection of the second adjacent lens LEN2 on the base substrate BS.

Referring to FIG. 7, FIG. 11A, FIG. 11B, and FIG. 13, in some embodiments, an orthographic projection of the first adjacent lens LEN1 on a base substrate BS covers an orthographic projection of the fourth portion P4 on the base substrate BS; and an orthographic projection of the second adjacent lens LEN2 on the base substrate BS covers an orthographic projection of the fifth portion P5 on the base substrate BS.

Referring to FIG. 7, FIG. 11A, FIG. 11B, and FIG. 13, in some embodiments, an orthographic projection of the first recess portion RS1 on the base substrate BS partially overlaps with the orthographic projection of the lens layer LENL on the base substrate BS. Optionally, the orthographic projection of the first recess portion RS1 on the base substrate BS partially overlaps with the orthographic projection of the first adjacent lens LEN1 on the base substrate BS, and partially overlaps with the orthographic projection of the second adjacent lens LEN2 on the base substrate BS.

The inventors of the present disclosure discover that a synergistic effect may be achieved by having a non-spherical portion of the respective lens. In particular, when an alignment errors occurs in assembly the display panel, any light leakage in the inter-subpixel region is not prone to enter the respective lens (e.g., the first adjacent lens LEN1 or the second adjacent lens LEN2), thereby reducing crosstalk between adjacent subpixels and obviating mura.

Figure 14:
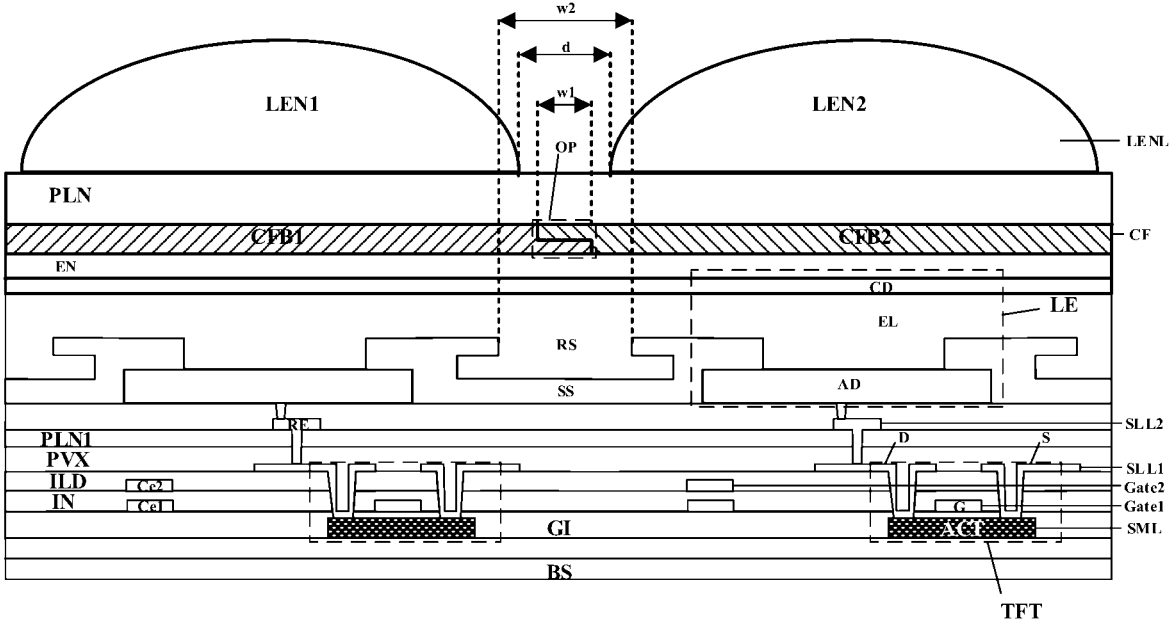
FIG. 14 is a cross-sectional view of a display panel in some embodiments according to the present disclosure.
Figure 15:
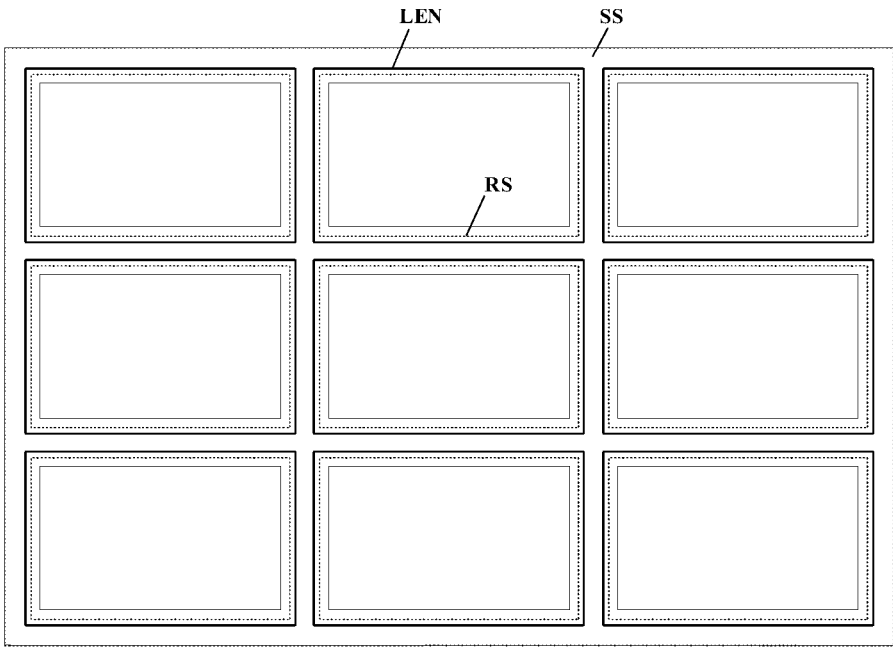
FIG. 15 is a plan view of a lens layer and a separation structure and a recess in some embodiments according to the present disclosure.

FIG. 14 is a cross-sectional view of a display panel in some embodiments according to the present disclosure. FIG. 15 is a plan view of a lens layer and a separation structure and a recess in some embodiments according to the present disclosure. Referring to FIG. 14 and FIG. 15, in some embodiments, an orthographic projection of a respective lens of the plurality of lenses LEN on a base substrate BS partially overlaps with an orthographic projection of the separation structure SS on the base substrate BS. In some embodiments, the separation structure SS is a network continuously extending in a region between adjacent anodes of adjacent subpixels in the display panel. In the example depicted in FIG. 14 and FIG. 15, an orthographic projection of the plurality of lenses LEN on a base substrate BS is partially overlapping with an orthographic projection of the recess RS on the base substrate BS.

Figure 16:
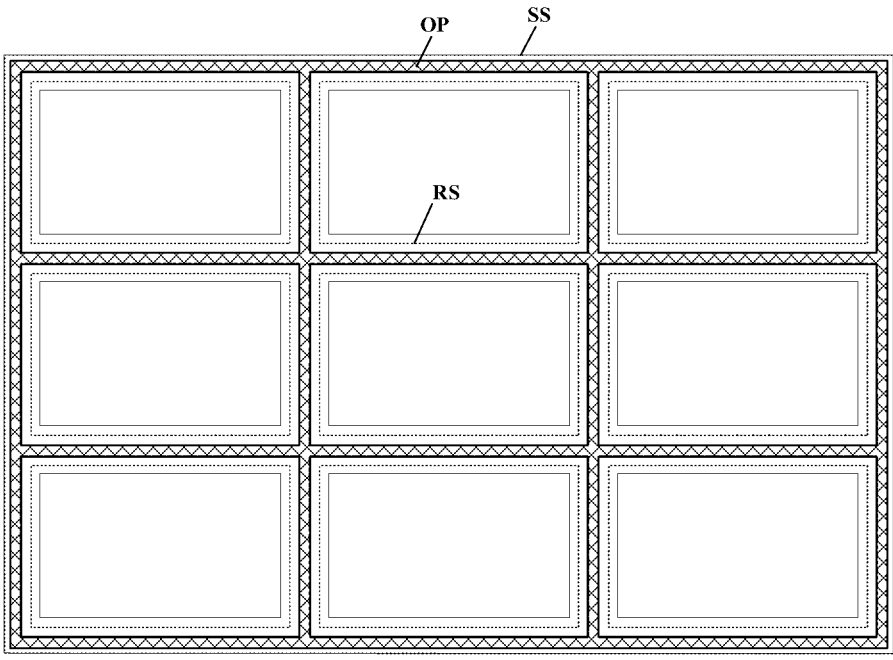
FIG. 16 is a plan view of a lens layer and a separation structure and an overlapping portion in some embodiments according to the present disclosure.

FIG. 16 is a plan view of a lens layer and a separation structure and an overlapping portion in some embodiments according to the present disclosure. FIG. 16 shows an overlapping portion OP in the color filter without showing other portions of the color filter for illustration purpose. Referring to FIG. 14 and FIG. 16, in some embodiments, the overlapping portion OP is a network continuously extending in an inter-subpixel region of the display panel. In some embodiments, an orthographic projection of the separation structure SS on a base substrate BS at least partially overlaps with an orthographic projection of the overlapping portion OP on the base substrate BS. Optionally, the orthographic projection of the separation structure SS on the base substrate BS covers the orthographic projection of the overlapping portion OP on the base substrate BS. In some embodiments, an orthographic projection of the recess RS on a base substrate BS at least partially overlaps with an orthographic projection of the overlapping portion OP on the base substrate BS. Optionally, the orthographic projection of the recess RS on the base substrate BS covers the orthographic projection of the overlapping portion OP on the base substrate BS. In one example, the overlapping portion OP is limited in a region corresponding to the recess RS.

Figure 17:
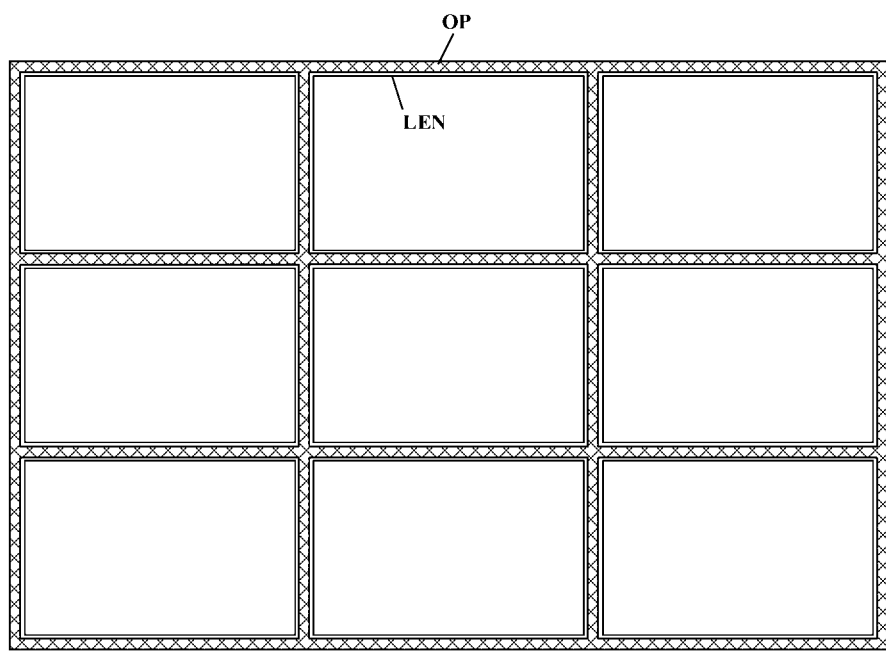
FIG. 17 is a plan view of a lens layer and an overlapping portion in some embodiments according to the present disclosure.

FIG. 17 is a plan view of a lens layer and an overlapping portion in some embodiments according to the present disclosure. FIG. 17 shows an overlapping portion OP in the color filter without showing other portions of the color filter for illustration purpose. Referring to FIG. 14 and FIG. 17, in some embodiments, the lens layer includes a plurality of lenses LEN. In the example depicted in FIG. 14 and FIG. 17, an orthographic projection of the plurality of lenses LEN on a base substrate BS is substantially non-overlapping (e.g., completely non-overlapping) with an orthographic projection of the overlapping portion OP on the base substrate BS.

In some embodiments, the display panel includes a recess RS extending into the separation structure SS. Optionally, referring to FIG. 14, the recess RS is a network continuously extending in an inter-subpixel region of the display panel.

Figure 18:
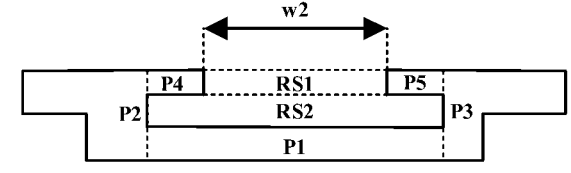
FIG. 18 is a cross-sectional view of a separation structure and a recess in some embodiments according to the present disclosure.

FIG. 18 is a cross-sectional view of a separation structure and a recess in some embodiments according to the present disclosure. Referring to FIG. 14 and FIG. 18, in a cross-section along a plane perpendicular to the base substrate BS and intersecting the separation structure SS and the plurality of lenses in a plurality of subpixels, the recess RS includes a first recess portion RS1 and a second recess portion RS2 connected with each other. The first recess portion RS1 is on a side of the second recess portion RS2 away from the base substrate BS. In the cross-section along the plane perpendicular to the base substrate BS and intersecting the separation structure SS and the plurality of lenses in a plurality of subpixels, the second recess portion RS2 has a width greater than a width of the first recess portion RS1.

Referring to FIG. 14 and FIG. 18, in a cross-section along a plane perpendicular to the base substrate BS and intersecting the separation structure SS and the plurality of lenses in a plurality of subpixels, the separation structure SS includes a first portion P1, a second portion P2, a third portion P3, a fourth portion P4, and a fifth portion P5. The first portion P1 connects the second portion P2 and the third portion P3. The second portion P2 connects the first portion P1 and the fourth portion P4. The third portion P3 connects the first portion P1 and the fifth portion P5. The second portion P2 and the third portion P3 are spaced apart by the second recess portion RS2. The fourth portion P4 and the fifth portion P5 are spaced apart by the first recess portion RS1.

In some embodiments, the second recess portion RS2 is surrounded by the first portion P1, the second portion P2, the third portion P3, the fourth portion P4, the fifth portion P5, and the first recess portion RS1. The first recess portion RS1 is partially surrounded by the fourth portion P4, the fifth portion P5, and the second recess portion RS2. The first recess portion RS1 spaces apart the fourth portion P4 and the fifth portion P5. The second recess portion RS2 spaces apart the second portion P2 and the third portion P3. The second recess portion RS2 spaces apart the first recess portion RS1 and the first portion P1.

In some embodiments, the display panel includes an organic material at least partially in the recess RS including the first recess portion RS1 and the second recess portion RS2. Optionally, the organic material is a residual organic material deposited during a process of forming a common layer using an open mask. Examples of common layers include a hole injection layer, a hole transport layer, an electron injection layer, and an electron transport layer. The separation structure SS at least partially segregates the common layer into discontinuous segments, thereby defining a plurality of subpixels.

In some embodiments, the separation structure SS includes an insulating material.

In some embodiments, in a cross-section along a plane perpendicular to the base substrate BS and intersecting the separation structure SS and the plurality of lenses in a plurality of subpixels, the recess RS has a L shape.

Figure 19:
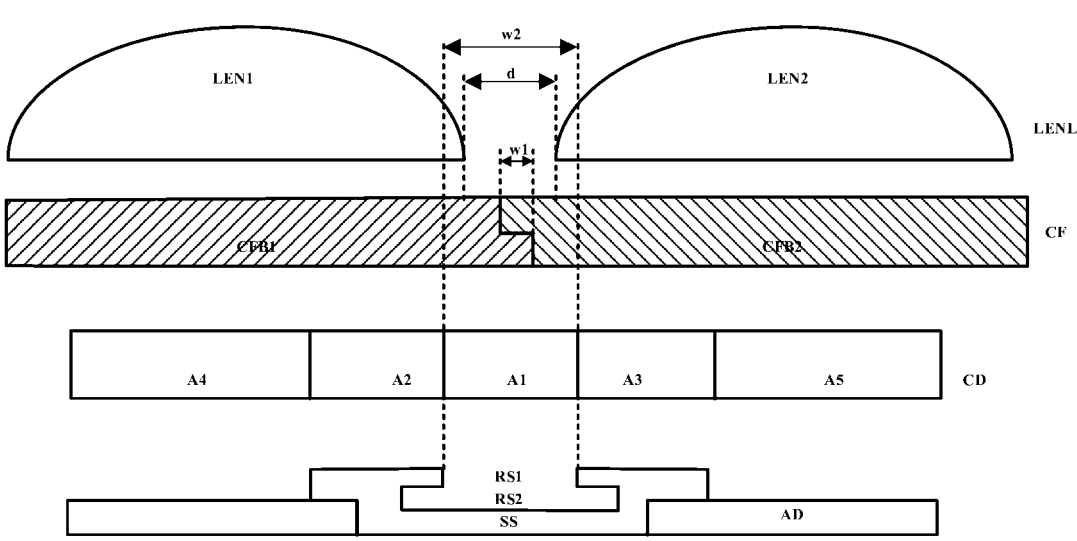
FIG. 19 illustrates a light path in a display panel in some embodiments according to the present disclosure.

FIG. 19 illustrates a light path in a display panel in some embodiments according to the present disclosure. The light path illustrated in FIG. 19 corresponds to a light path in a display panel having the structure depicted in FIG. 14. Referring to FIG. 19, in some embodiments, in a cross-section along a plane perpendicular to the base substrate BS and intersecting the separation structure SS and the plurality of lenses in a plurality of subpixels, the overlapping portion OP has a first width w1; the first adjacent lens LEN1 and the second adjacent lens LEN2 are spaced apart from each other by a distance d; and the first recess portion RS1 has a second width w2.

Referring to FIG. 19, the cathode CD has a first region A1, a second region A2, a third region A3, a fourth region A4, and a fifth region A5. The first region A1 corresponds to the first recess portion RS1. Because organic material layers (e.g., any common layer) are segregated due to the presence of the first recess portion RS1, any light emitting material deposited in the recess does not emit light. Accordingly, there is no light leakage in first region A1.

The fourth region A4 and the fifth region A5 correspond to normal light emitting regions of two adjacent subpixels, respectively.

Referring to FIG. 18 and FIG. 19, the second region A2 corresponds to the second portion P2 and the fourth portion P4 of the separation structure SS, the third region A3 corresponds to the third portion P3 and the fifth portion P5 of the separation structure SS. The organic material layers are deposited on the second portion P2, the third portion P3, the fourth portion P4, and the fifth portion P5. In regions corresponding to the second portion P2, the third portion P3, the fourth portion P4, and the fifth portion P5, the anode AD is either absent or spaced apart from the organic material layers by the separation structure SS. Due to horizontal current in the organic material layer, the second region A2 and the third region A3 are prone to light leakage.

In some embodiments, d is greater than w1. The inventors of the present disclosure discover that, by having d greater than w1, color crosstalk between adjacent subpixels can be reduced or obviated.

In some embodiments, w2 is greater than d. The inventors of the present disclosure discover that, by having w2 greater than d, light leakage in the region between adjacent lenses (e.g., LEN1 and LEN2) can be reduced or obviated. Comparing FIG. 19 with FIG. 6, the first light leakage area LA1 or the second light leakage area LA2 depicted in FIG. 6 is not present in FIG. 19. Referring to FIG. 14, FIG. 18, and FIG. 19, in some embodiments, an orthographic projection of the first adjacent lens LEN1 on a base substrate BS covers an orthographic projection of the second region A2 on the base substrate BS; and an orthographic projection of the second adjacent lens LEN2 on the base substrate BS covers an orthographic projection of the third region A3 on the base substrate BS. Optionally, an orthographic projection of the first region A1 on the base substrate BS is partially overlapping with the orthographic projection of the lens layer LENL on the base substrate BS. In one example, the orthographic projection of the first region A1 on the base substrate BS is partially overlapping with the orthographic projection of the first adjacent lens LEN1 on the base substrate BS, and partially overlapping with the orthographic projection of the second adjacent lens LEN2 on the base substrate BS.

Referring to FIG. 14, FIG. 18, and FIG. 19, in some embodiments, an orthographic projection of the first adjacent lens LEN1 on a base substrate BS covers an orthographic projection of the fourth portion P4 on the base substrate BS; and an orthographic projection of the second adjacent lens LEN2 on the base substrate BS covers an orthographic projection of the fifth portion P5 on the base substrate BS.

Referring to FIG. 14, FIG. 18, and FIG. 19, in some embodiments, an orthographic projection of the first recess portion RS1 on the base substrate BS partially overlaps with the orthographic projection of the lens layer LENL on the base substrate BS. Optionally, the orthographic projection of the first recess portion RS1 on the base substrate BS partially overlaps with the orthographic projection of the first adjacent lens LEN1 on the base substrate BS, and partially overlaps with the orthographic projection of the second adjacent lens LEN2 on the base substrate BS.

Figure 20:
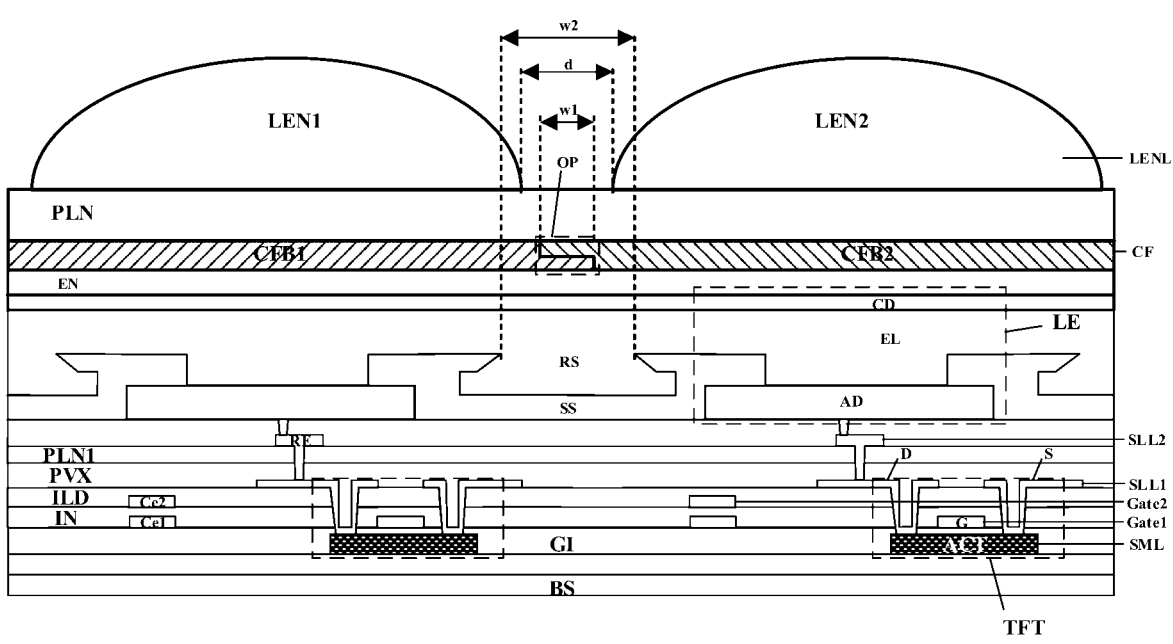
FIG. 20 is a cross-sectional view of a display panel in some embodiments according to the present disclosure.
Figure 21:
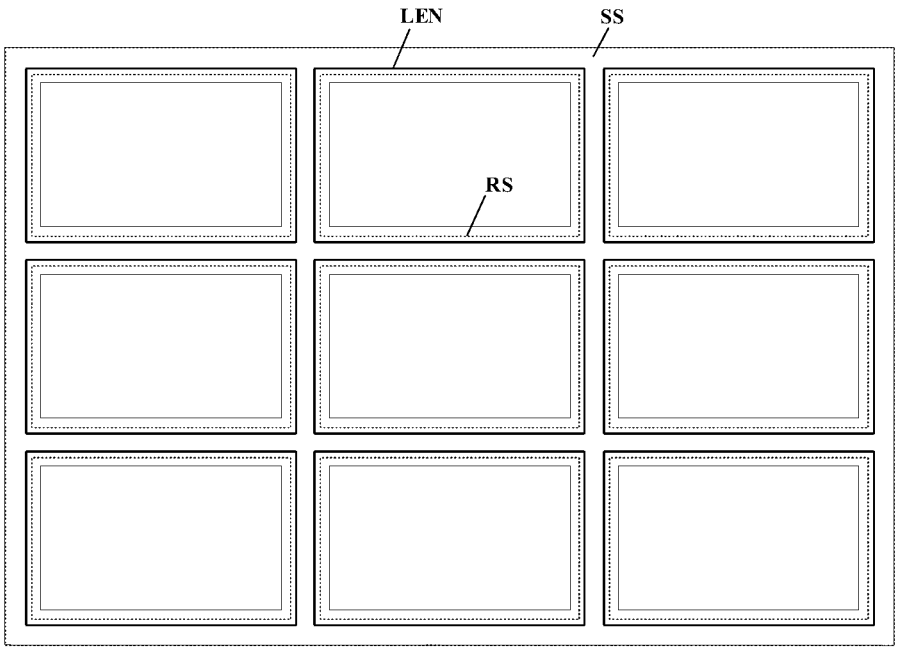
FIG. 21 is a plan view of a lens layer and a separation structure and a recess in some embodiments according to the present disclosure.

FIG. 20 is a cross-sectional view of a display panel in some embodiments according to the present disclosure. FIG. 21 is a plan view of a lens layer and a separation structure and a recess in some embodiments according to the present disclosure. Referring to FIG. 20 and FIG. 21, in some embodiments, an orthographic projection of a respective lens of the plurality of lenses LEN on a base substrate BS partially overlaps with an orthographic projection of the separation structure SS on the base substrate BS. In some embodiments, the separation structure SS is a network continuously extending in a region between adjacent anodes of adjacent subpixels in the display panel. In the example depicted in FIG. 20 and FIG. 21, an orthographic projection of the plurality of lenses LEN on a base substrate BS is partially overlapping with an orthographic projection of the recess RS on the base substrate BS.

Figure 22:
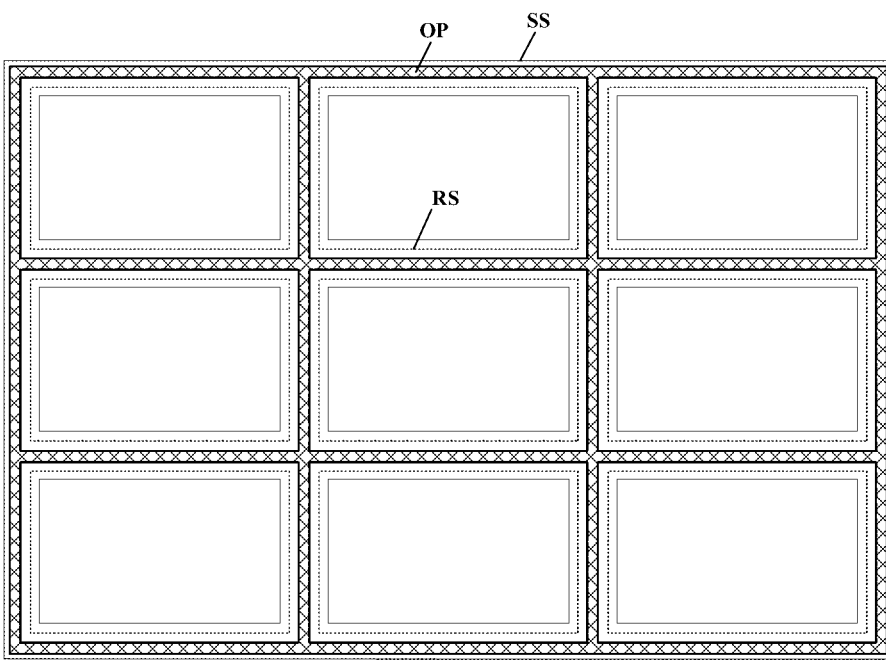
FIG. 22 is a plan view of a lens layer and a separation structure and an overlapping portion in some embodiments according to the present disclosure.

FIG. 22 is a plan view of a lens layer and a separation structure and an overlapping portion in some embodiments according to the present disclosure. FIG. 22 shows an overlapping portion OP in the color filter without showing other portions of the color filter for illustration purpose. Referring to FIG. 20 and FIG. 22, in some embodiments, the overlapping portion OP is a network continuously extending in an inter-subpixel region of the display panel. In some embodiments, an orthographic projection of the separation structure SS on a base substrate BS at least partially overlaps with an orthographic projection of the overlapping portion OP on the base substrate BS. Optionally, the orthographic projection of the separation structure SS on the base substrate BS covers the orthographic projection of the overlapping portion OP on the base substrate BS. In some embodiments, an orthographic projection of the recess RS on a base substrate BS at least partially overlaps with an orthographic projection of the overlapping portion OP on the base substrate BS. Optionally, the orthographic projection of the recess RS on the base substrate BS covers the orthographic projection of the overlapping portion OP on the base substrate BS. In one example, the overlapping portion OP is limited in a region corresponding to the recess RS.

Figure 23:
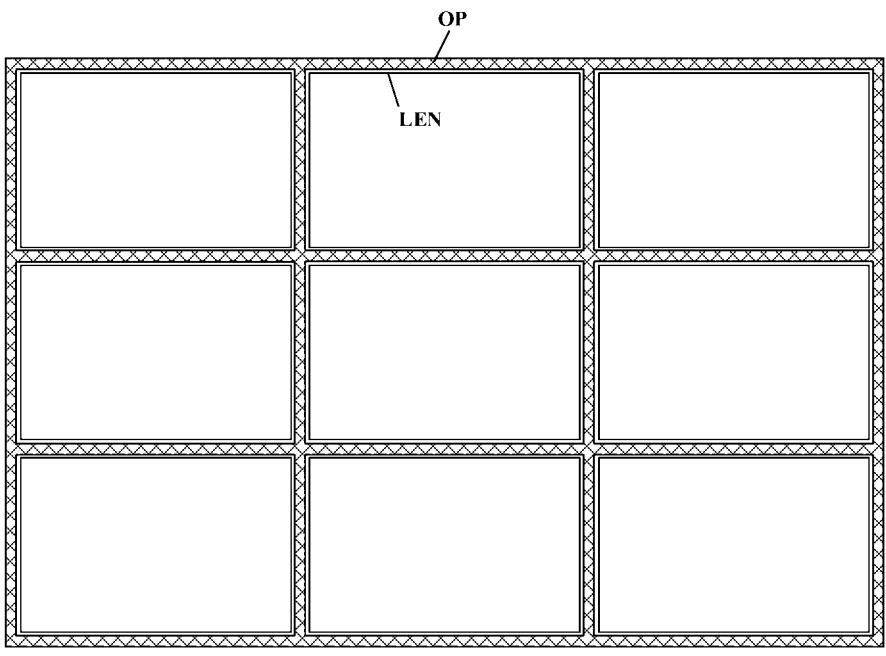
FIG. 23 is a plan view of a lens layer and an overlapping portion in some embodiments according to the present disclosure.

FIG. 23 is a plan view of a lens layer and an overlapping portion in some embodiments according to the present disclosure. FIG. 23 shows an overlapping portion OP in the color filter without showing other portions of the color filter for illustration purpose. Referring to FIG. 20 and FIG. 23, in some embodiments, the lens layer includes a plurality of lenses LEN. In the example depicted in FIG. 20 and FIG. 23, an orthographic projection of the plurality of lenses LEN on a base substrate BS is substantially non-overlapping (e.g., completely non-overlapping) with an orthographic projection of the overlapping portion OP on the base substrate BS.

In some embodiments, the display panel includes a recess RS extending into the separation structure SS. Optionally, referring to FIG. 20, the recess RS is a network continuously extending in an inter-subpixel region of the display panel.

Figure 24:
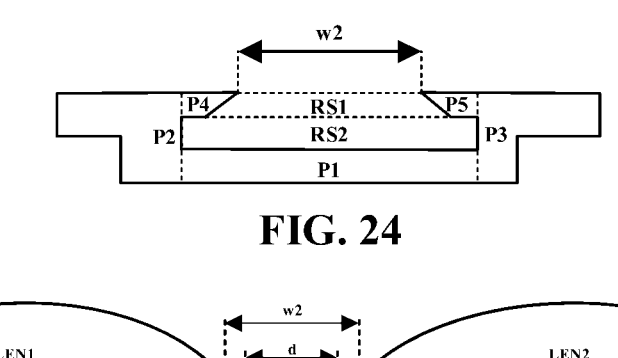
FIG. 24 is a cross-sectional view of a separation structure and a recess in some embodiments according to the present disclosure.

FIG. 24 is a cross-sectional view of a separation structure and a recess in some embodiments according to the present disclosure. Referring to FIG. 20 and FIG. 24, in a cross-section along a plane perpendicular to the base substrate BS and intersecting the separation structure SS and the plurality of lenses in a plurality of subpixels, the recess RS includes a first recess portion RS1 and a second recess portion RS2 connected with each other. The first recess portion RS1 is on a side of the second recess portion RS2 away from the base substrate BS. In the cross-section along the plane perpendicular to the base substrate BS and intersecting the separation structure SS and the plurality of lenses in a plurality of subpixels, the second recess portion RS2 has a width greater than a width of the first recess portion RS1.

In the embodiments depicted in FIG. 4, FIG. 11A, FIG. 11B, and FIG. 18, in a cross-section along a plane perpendicular to the base substrate BS and intersecting the separation structure SS and the plurality of lenses in a plurality of subpixels, the first recess portion RS1 has a rectangular shape, and the second recess portion RS2 has a rectangular shape. In the embodiment depicted in FIG. 24, the second recess portion RS2 has a rectangular shape, the first recess portion RS1 has an inverted trapezoidal shape.

Referring to FIG. 20 and FIG. 24, in a cross-section along a plane perpendicular to the base substrate BS and intersecting the separation structure SS and the plurality of lenses in a plurality of subpixels, the separation structure SS includes a first portion P1, a second portion P2, a third portion P3, a fourth portion P4, and a fifth portion P5. The first portion P1 connects the second portion P2 and the third portion P3. The second portion P2 connects the first portion P1 and the fourth portion P4. The third portion P3 connects the first portion P1 and the fifth portion P5. The second portion P2 and the third portion P3 are spaced apart by the second recess portion RS2. The fourth portion P4 and the fifth portion P5 are spaced apart by the first recess portion RS1.

In the embodiments depicted in FIG. 4, FIG. 11A, FIG. 11B, and FIG. 18, in a cross-section along a plane perpendicular to the base substrate BS and intersecting the separation structure SS and the plurality of lenses in a plurality of subpixels, the fourth portion P4 has a rectangular shape, and the fifth portion P5 has a rectangular shape. In the embodiment depicted in FIG. 24, the fourth portion P4 has a knife-tip shape, the fifth portion P5 has a knife-tip shape. Optionally, the shape of the fourth portion P4 comprises a rectangular portion and a triangular portion connected together, the triangular portion being on a side of the rectangular portion away from the second portion P2, the rectangular portion connecting the triangular portion to the second portion P2. Optionally, the shape of the fifth portion P5 comprises a rectangular portion and a triangular portion connected together, the triangular portion being on a side of the rectangular portion away from the third portion P3, the rectangular portion connecting the triangular portion to the third portion P3.

In some embodiments, the second recess portion RS2 is surrounded by the first portion P1, the second portion P2, the third portion P3, the fourth portion P4, the fifth portion P5, and the first recess portion RS1. The first recess portion RS1 is partially surrounded by the fourth portion P4, the fifth portion P5, and the second recess portion RS2. The first recess portion RS1 spaces apart the fourth portion P4 and the fifth portion P5. The second recess portion RS2 spaces apart the second portion P2 and the third portion P3. The second recess portion RS2 spaces apart the first recess portion RS1 and the first portion P1.

In some embodiments, the display panel includes an organic material at least partially in the recess RS including the first recess portion RS1 and the second recess portion RS2. Optionally, the organic material is a residual organic material deposited during a process of forming a common layer using an open mask. Examples of common layers include a hole injection layer, a hole transport layer, an electron injection layer, and an electron transport layer. The separation structure SS at least partially segregates the common layer into discontinuous segments, thereby defining a plurality of subpixels.

In some embodiments, the separation structure SS includes an insulating material.

In some embodiments, in a cross-section along a plane perpendicular to the base substrate BS and intersecting the separation structure SS and the plurality of lenses in a plurality of subpixels, the recess RS has a pseudo 1 shape.

Figure 25:
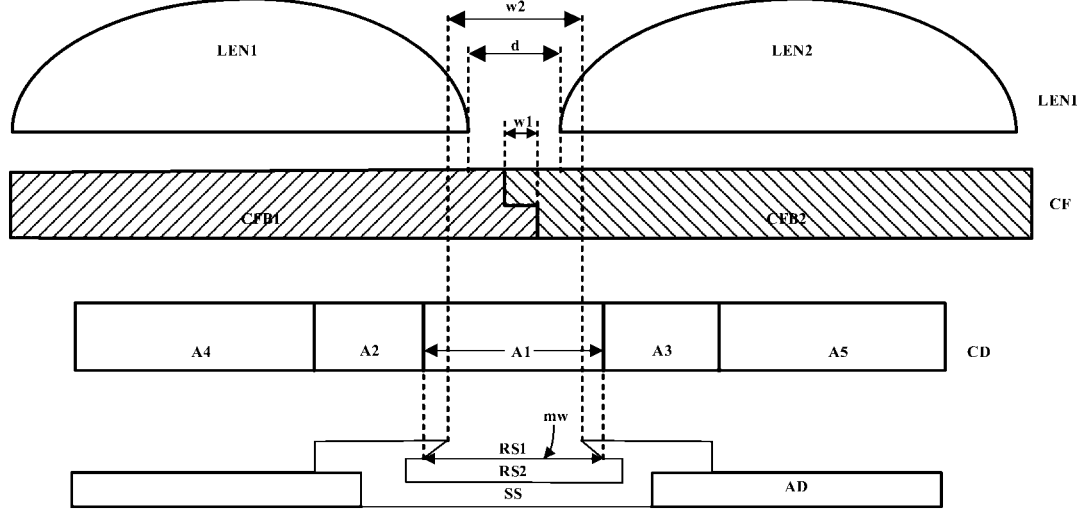
FIG. 25 illustrates a light path in a display panel in some embodiments according to the present disclosure.

FIG. 25 illustrates a light path in a display panel in some embodiments according to the present disclosure. The light path illustrated in FIG. 25 corresponds to a light path in a display panel having the structure depicted in FIG. 20. Referring to FIG. 25, in some embodiments, in a cross-section along a plane perpendicular to the base substrate BS and intersecting the separation structure SS and the plurality of lenses in a plurality of subpixels, the overlapping portion OP has a first width $w1$; the first adjacent lens LEN1 and the second adjacent lens LEN2 are spaced apart from each other by a distance $d$; and the first recess portion RS1 has a second width $w2$.

Referring to FIG. 25, the cathode CD has a first region A1, a second region A2, a third region A3, a fourth region A4, and a fifth region A5. As compared to the embodiments depicted in FIG. 6, FIG. 13, and FIG. 19, the embodiment depicted in FIG. 25 has an enlarged A1 region. Because the fourth portion P4 has a shape comprising a rectangular portion and a triangular portion, and the fifth portion P5 has a shape comprising a rectangular portion and a triangular portion, the A1 region that does not emit light increases to approximately edges of the triangular portions connected to the rectangular portions, respectively. In one example, the triangular portion of the shape of the fourth portion P4 has a first side connected to the rectangular portion of the shape of the fourth portion P4, a second side, and a hypotenuse, the second side being on a side of the hypotenuse away from the recess RS. In another example, the triangular portion of the shape of the fifth portion P5 has a first side connected to the rectangular portion of the shape of the fifth portion P5, a second side, and a hypotenuse, the second side being on a side of the hypotenuse away from the recess RS.

In some embodiments, in a cross-section along a plane perpendicular to the base substrate BS and intersecting the separation structure SS and the plurality of lenses in a plurality of subpixels, a width of the first region A1 is substantially the same as a maximum width mw of the first recess portion RS1. In some embodiments, in a cross-section along a plane perpendicular to the base substrate BS and intersecting the separation structure SS and the plurality of lenses in a plurality of subpixels, the first region A1 is a region from a boundary between the rectangular portion and the triangular portion of the fourth portion P4 to a boundary between the rectangular portion and the triangular portion of the fifth portion P5.

The fourth region A4 and the fifth region A5 correspond to normal light emitting regions of two adjacent subpixels, respectively.

Referring to FIG. 24 and FIG. 25, the second region A2 corresponds to the second portion P2 and the rectangular portion of the fourth portion P4 of the separation structure SS, the third region A3 corresponds to the third portion P3 and the rectangular portion of the fifth portion P5 of the separation structure SS. Due to horizontal current in the organic material layer, the second region A2 and the third region A3 are prone to light leakage.

In some embodiments, $d$ is greater than $w1$. The inventors of the present disclosure discover that, by having $d$ greater than $w1$, color crosstalk between adjacent subpixels can be reduced or obviated.

In some embodiments, $w2$ is greater than $d$. The inventors of the present disclosure discover that, by having $w2$ greater than $d$, light leakage in the region between adjacent lenses (e.g., LEN1 and LEN2) can be reduced or obviated. Comparing FIG. 25 with FIG. 6, the first light leakage area LA1 or the second light leakage area LA2 depicted in FIG. 6 is not present in FIG. 25. Referring to FIG. 20, FIG. 24, and FIG. 25, in some embodiments, an orthographic projection of the first adjacent lens LEN1 on a base substrate BS covers an orthographic projection of the second region A2 on the base substrate BS; and an orthographic projection of the second adjacent lens LEN2 on the base substrate BS covers an orthographic projection of the third region A3 on the base substrate BS. Optionally, an orthographic projection of the first region A1 on the base substrate BS is partially overlapping with the orthographic projection of the lens layer LENL on the base substrate BS. In one example, the orthographic projection of the first region A1 on the base substrate BS is partially overlapping with the orthographic projection of the first adjacent lens LEN1 on the base substrate BS, and partially overlapping with the orthographic projection of the second adjacent lens LEN2 on the base substrate BS.

Referring to FIG. 20, FIG. 24, and FIG. 25, in some embodiments, an orthographic projection of the first adjacent lens LEN1 on a base substrate BS covers an orthographic projection of the fourth portion P4 on the base substrate BS; and an orthographic projection of the second adjacent lens LEN2 on the base substrate BS covers an orthographic projection of the fifth portion P5 on the base substrate BS.

Referring to FIG. 20, FIG. 24, and FIG. 25, in some embodiments, an orthographic projection of the first recess portion RS1 on the base substrate BS partially overlaps with the orthographic projection of the lens layer LENL on the base substrate BS. Optionally, the orthographic projection of the first recess portion RS1 on the base substrate BS partially overlaps with the orthographic projection of the first adjacent lens LEN1 on the base substrate BS, and partially overlaps with the orthographic projection of the second adjacent lens LEN2 on the base substrate BS.

Figure 26:
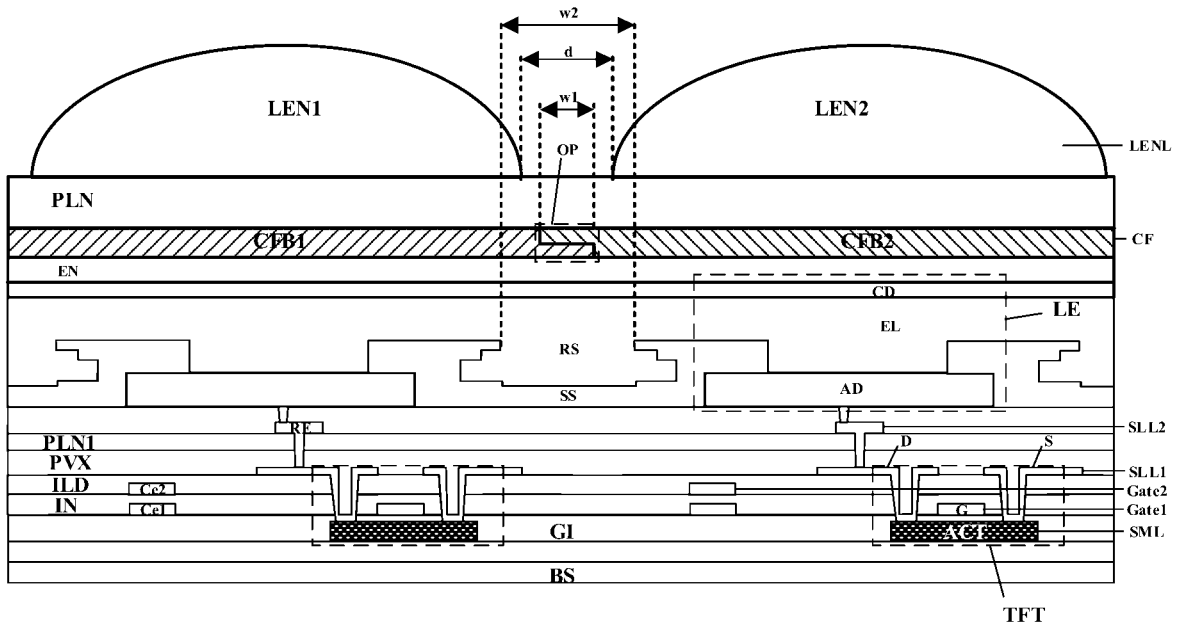
FIG. 26 is a cross-sectional view of a display panel in some embodiments according to the present disclosure.
Figure 27:
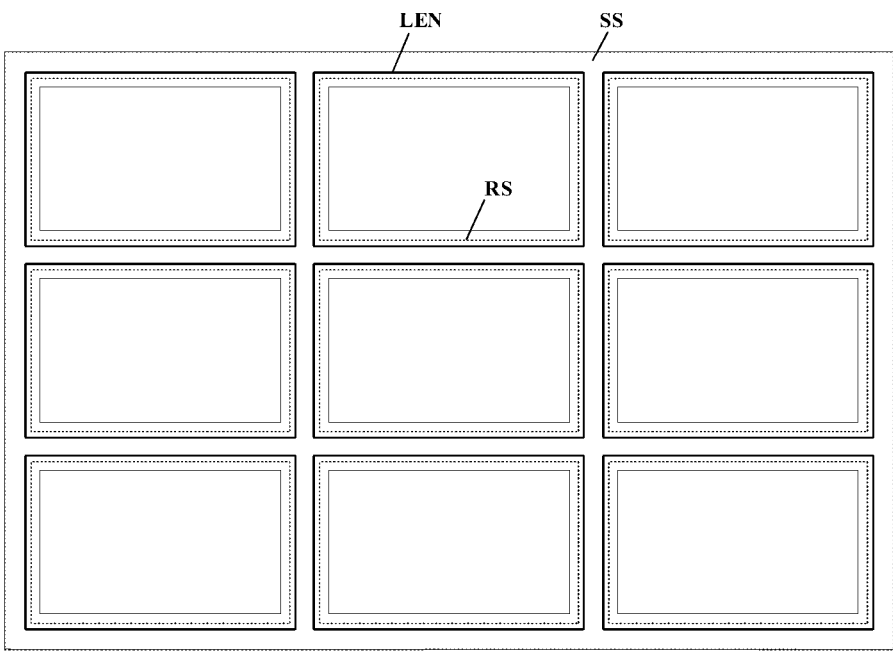
FIG. 27 is a plan view of a lens layer and a separation structure and a recess in some embodiments according to the present disclosure.

FIG. 26 is a cross-sectional view of a display panel in some embodiments according to the present disclosure. FIG. 27 is a plan view of a lens layer and a separation structure and a recess in some embodiments according to the present disclosure. Referring to FIG. 26 and FIG. 27, in some embodiments, an orthographic projection of a respective lens of the plurality of lenses LEN on a base substrate BS partially overlaps with an orthographic projection of the separation structure SS on the base substrate BS. In some embodiments, the separation structure SS is a network continuously extending in a region between adjacent anodes of adjacent subpixels in the display panel. In the example depicted in FIG. 26 and FIG. 27, an orthographic projection of the plurality of lenses LEN on a base substrate BS is partially overlapping with an orthographic projection of the recess RS on the base substrate BS.

Figure 28:
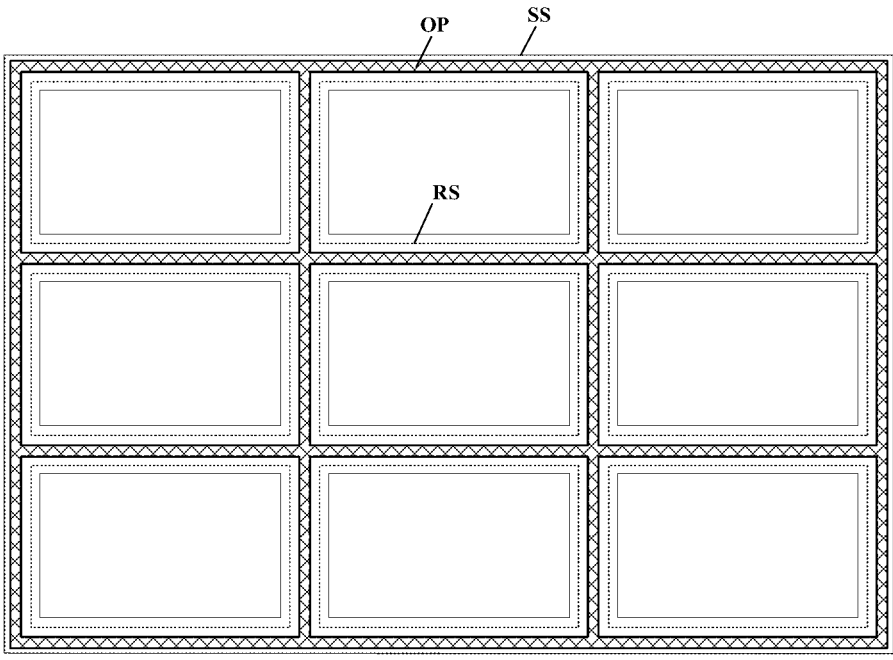
FIG. 28 is a plan view of a lens layer and a separation structure and an overlapping portion in some embodiments according to the present disclosure.

FIG. 28 is a plan view of a lens layer and a separation structure and an overlapping portion in some embodiments according to the present disclosure. FIG. 28 shows an overlapping portion OP in the color filter without showing other portions of the color filter for illustration purpose. Referring to FIG. 26 and FIG. 28, in some embodiments, the overlapping portion OP is a network continuously extending in an inter-subpixel region of the display panel. In some embodiments, an orthographic projection of the separation structure SS on a base substrate BS at least partially overlaps with an orthographic projection of the overlapping portion OP on the base substrate BS. Optionally, the orthographic projection of the separation structure SS on the base substrate BS covers the orthographic projection of the overlapping portion OP on the base substrate BS. In some embodiments, an orthographic projection of the recess RS on a base substrate BS at least partially overlaps with an orthographic projection of the overlapping portion OP on the base substrate BS. Optionally, the orthographic projection of the recess RS on the base substrate BS covers the orthographic projection of the overlapping portion OP on the base substrate BS. In one example, the overlapping portion OP is limited in a region corresponding to the recess RS.

Figure 29:
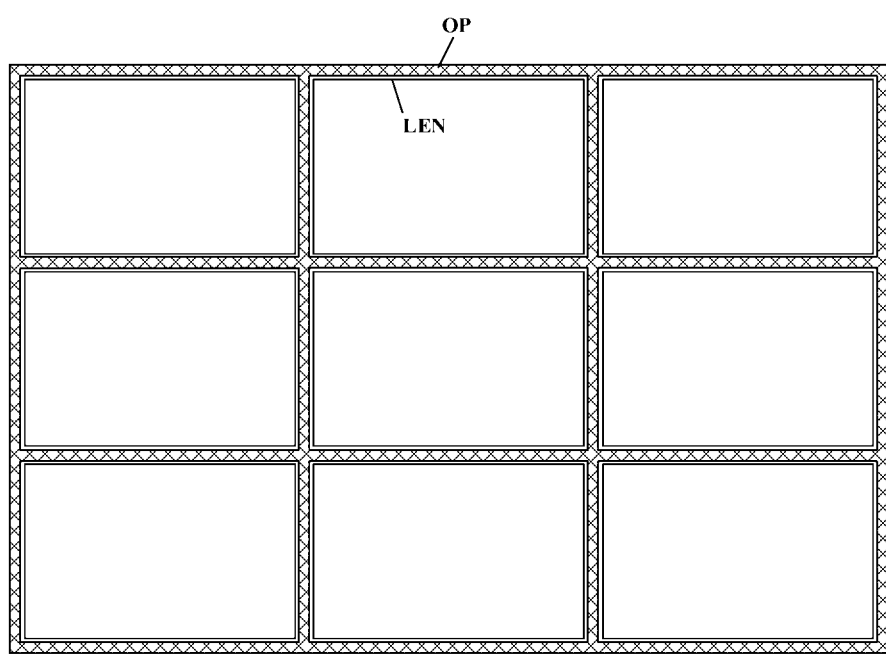
FIG. 29 is a plan view of a lens layer and an overlapping portion in some embodiments according to the present disclosure.

FIG. 29 is a plan view of a lens layer and an overlapping portion in some embodiments according to the present disclosure. FIG. 29 shows an overlapping portion OP in the color filter without showing other portions of the color filter for illustration purpose. Referring to FIG. 26 and FIG. 29, in some embodiments, the lens layer includes a plurality of lenses LEN. In the example depicted in FIG. 26 and FIG. 29, an orthographic projection of the plurality of lenses LEN on a base substrate BS is substantially non-overlapping (e.g., completely non-overlapping) with an orthographic projection of the overlapping portion OP on the base substrate BS.

In some embodiments, the display panel includes a recess RS extending into the separation structure SS. Optionally, referring to FIG. 26, the recess RS is a network continuously extending in an inter-subpixel region of the display panel.

Figure 30:
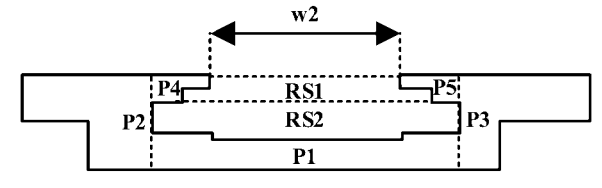
FIG. 30 is a cross-sectional view of a separation structure and a recess in some embodiments according to the present disclosure.

FIG. 30 is a cross-sectional view of a separation structure and a recess in some embodiments according to the present disclosure. Referring to FIG. 26 and FIG. 30, in a cross-section along a plane perpendicular to the base substrate BS and intersecting the separation structure SS and the plurality of lenses in a plurality of subpixels, the recess RS includes a first recess portion RS1 and a second recess portion RS2 connected with each other. The first recess portion RS1 is on a side of the second recess portion RS2 away from the base substrate BS. In the cross-section along the plane perpendicular to the base substrate BS and intersecting the separation structure SS and the plurality of lenses in a plurality of subpixels, the second recess portion RS2 has a width greater than a width of the first recess portion RS1.

In the embodiments depicted in FIG. 4, FIG. 11A, FIG. 11B, and FIG. 18, in a cross-section along a plane perpendicular to the base substrate BS and intersecting the separation structure SS and the plurality of lenses in a plurality of subpixels, the first recess portion RS1 has a rectangular shape, and the second recess portion RS2 has a rectangular shape. In the embodiment depicted in FIG. 30, the second recess portion RS2 has a substantially rectangular shape, the first recess portion RS1 has step shape. The step shape includes a first rectangular portion and a second rectangular portion on a side of the first rectangular portion away from the first portion P1. In the cross-section along the plane perpendicular to the base substrate BS and intersecting the separation structure SS and the plurality of lenses in a plurality of subpixels, the second rectangular portion has a width greater than a width of the first rectangular portion.

Referring to FIG. 26 and FIG. 30, in a cross-section along a plane perpendicular to the base substrate BS and intersecting the separation structure SS and the plurality of lenses in a plurality of subpixels, the separation structure SS includes a first portion P1, a second portion P2, a third portion P3, a fourth portion P4, and a fifth portion P5. The first portion P1 connects the second portion P2 and the third portion P3. The second portion P2 connects the first portion P1 and the fourth portion P4. The third portion P3 connects the first portion P1 and the fifth portion P5. The second portion P2 and the third portion P3 are spaced apart by the second recess portion RS2. The fourth portion P4 and the fifth portion P5 are spaced apart by the first recess portion RS1.

In the embodiments depicted in FIG. 4, FIG. 11A, FIG. 11B, and FIG. 18, in a cross-section along a plane perpendicular to the base substrate BS and intersecting the separation structure SS and the plurality of lenses in a plurality of subpixels, the fourth portion P4 has a rectangular shape, and the fifth portion P5 has a rectangular shape. In the embodiment depicted in FIG. 30, the fourth portion P4 has a notched rectangular shape, the fifth portion P5 has a notched rectangular shape. Optionally, the shape of the fourth portion P4 comprises a first rectangular portion and a second rectangular portion connected together, the second rectangular portion being on a side of the first rectangular portion away from the second portion P2, the first rectangular portion connecting the second rectangular portion to the second portion P2. Optionally, the shape of the fifth portion P5 comprises a first rectangular portion and a second rectangular portion connected together, the second rectangular portion being on a side of the first rectangular portion away from the third portion P3, the first rectangular portion connecting the second rectangular portion to the third portion P3.

In some embodiments, the second recess portion RS2 is surrounded by the first portion P1, the second portion P2, the third portion P3, the fourth portion P4, the fifth portion P5, and the first recess portion RS1. The first recess portion RS1 is partially surrounded by the fourth portion P4, the fifth portion P5, and the second recess portion RS2. The first recess portion RS1 spaces apart the fourth portion P4 and the fifth portion P5. The second recess portion RS2 spaces apart the second portion P2 and the third portion P3. The second recess portion RS2 spaces apart the first recess portion RS1 and the first portion P1.

In some embodiments, the display panel includes an organic material at least partially in the recess RS including the first recess portion RS1 and the second recess portion RS2. Optionally, the organic material is a residual organic material deposited during a process of forming a common layer using an open mask. Examples of common layers include a hole injection layer, a hole transport layer, an electron injection layer, and an electron transport layer. The separation structure SS at least partially segregates the common layer into discontinuous segments, thereby defining a plurality of subpixels.

In some embodiments, the separation structure SS includes an insulating material.

Figure 31:
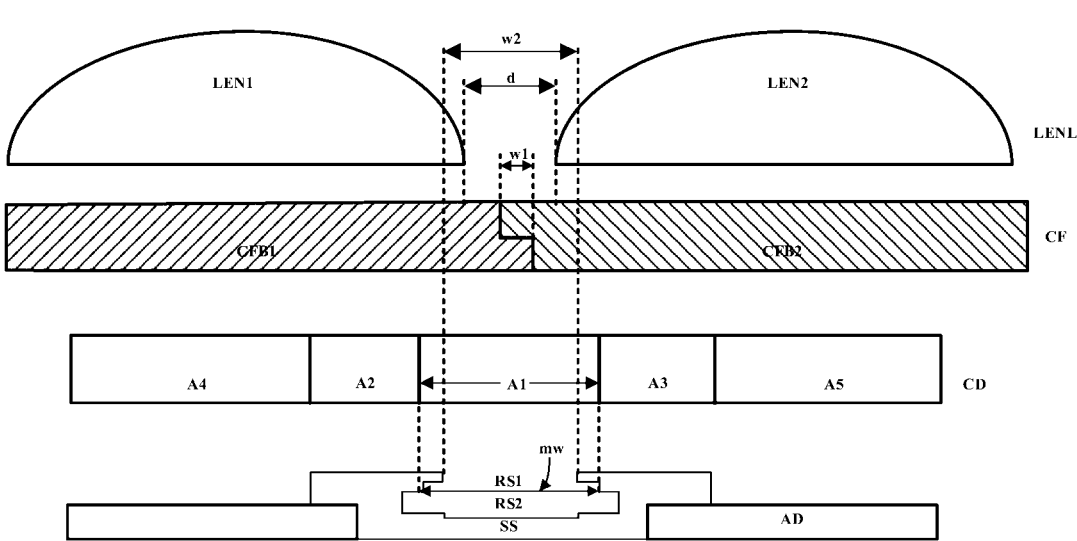
FIG. 31 illustrates a light path in a display panel in some embodiments according to the present disclosure.

FIG. 31 illustrates a light path in a display panel in some embodiments according to the present disclosure. The light path illustrated in FIG. 31 corresponds to a light path in a display panel having the structure depicted in FIG. 26. Referring to FIG. 31, in some embodiments, in a cross-section along a plane perpendicular to the base substrate BS and intersecting the separation structure SS and the plurality of lenses in a plurality of subpixels, the overlapping portion OP has a first width w1; the first adjacent lens LEN1 and the second adjacent lens LEN2 are spaced apart from each other by a distance d; and the first recess portion RS1 has a second width w2.

Referring to FIG. 31, the cathode CD has a first region A1, a second region A2, a third region A3, a fourth region A4, and a fifth region A5. As compared to the embodiments depicted in FIG. 6, FIG. 13, and FIG. 19, the embodiment depicted in FIG. 31 has an enlarged A1 region. Because the fourth portion P4 has a shape comprising a first rectangular portion and a second rectangular portion, and the fifth portion P5 has a shape comprising a first rectangular portion and a second rectangular portion, the A1 region that does not emit light increases to approximately edges of the second rectangular portions connected to the first rectangular portions, respectively.

In some embodiments, in a cross-section along a plane perpendicular to the base substrate BS and intersecting the separation structure SS and the plurality of lenses in a plurality of subpixels, a width of the first region A1 is substantially the same as a maximum width mw of the first recess portion RS1. In some embodiments, in a cross-section along a plane perpendicular to the base substrate BS and intersecting the separation structure SS and the plurality of lenses in a plurality of subpixels, the first region A1 is a region from a boundary between the first rectangular portion and the second rectangular portion of the fourth portion P4 to a boundary between the first rectangular portion and the second rectangular portion of the fifth portion P5.

The fourth region A4 and the fifth region A5 correspond to normal light emitting regions of two adjacent subpixels, respectively.

Referring to FIG. 30 and FIG. 31, the second region A2 corresponds to the second portion P2 and the first rectangular portion of the fourth portion P4 of the separation structure SS, the third region A3 corresponds to the third portion P3 and the first rectangular portion of the fifth portion P5 of the separation structure SS. Due to horizontal current in the organic material layer, the second region A2 and the third region A3 are prone to light leakage.

In some embodiments, d is greater than w1. The inventors of the present disclosure discover that, by having d greater than w1, color crosstalk between adjacent subpixels can be reduced or obviated.

In some embodiments, w2 is greater than d. The inventors of the present disclosure discover that, by having w2 greater than d, light leakage in the region between adjacent lenses (e.g., LEN1 and LEN2) can be reduced or obviated. Comparing FIG. 31 with FIG. 6, the first light leakage area LA1 or the second light leakage area LA2 depicted in FIG. 6 is not present in FIG. 31. Referring to FIG. 26, FIG. 30, and FIG. 31, in some embodiments, an orthographic projection of the first adjacent lens LEN1 on a base substrate BS covers an orthographic projection of the second region A2 on the base substrate BS; and an orthographic projection of the second adjacent lens LEN2 on the base substrate BS covers an orthographic projection of the third region A3 on the base substrate BS. Optionally, an orthographic projection of the first region A1 on the base substrate BS is partially overlapping with the orthographic projection of the lens layer LENL on the base substrate BS. In one example, the orthographic projection of the first region A1 on the base substrate BS is partially overlapping with the orthographic projection of the first adjacent lens LEN1 on the base substrate BS, and partially overlapping with the orthographic projection of the second adjacent lens LEN2 on the base substrate BS.

Referring to FIG. 26, FIG. 30, and FIG. 31, in some embodiments, an orthographic projection of the first adjacent lens LEN1 on a base substrate BS covers an orthographic projection of the fourth portion P4 on the base substrate BS; and an orthographic projection of the second adjacent lens LEN2 on the base substrate BS covers an orthographic projection of the fifth portion P5 on the base substrate BS.

Referring to FIG. 26, FIG. 30, and FIG. 31, in some embodiments, an orthographic projection of the first recess portion RS1 on the base substrate BS partially overlaps with the orthographic projection of the lens layer LENL on the base substrate BS. Optionally, the orthographic projection of the first recess portion RS1 on the base substrate BS partially overlaps with the orthographic projection of the first adjacent lens LEN1 on the base substrate BS, and partially overlaps with the orthographic projection of the second adjacent lens LEN2 on the base substrate BS.

Figure 32:
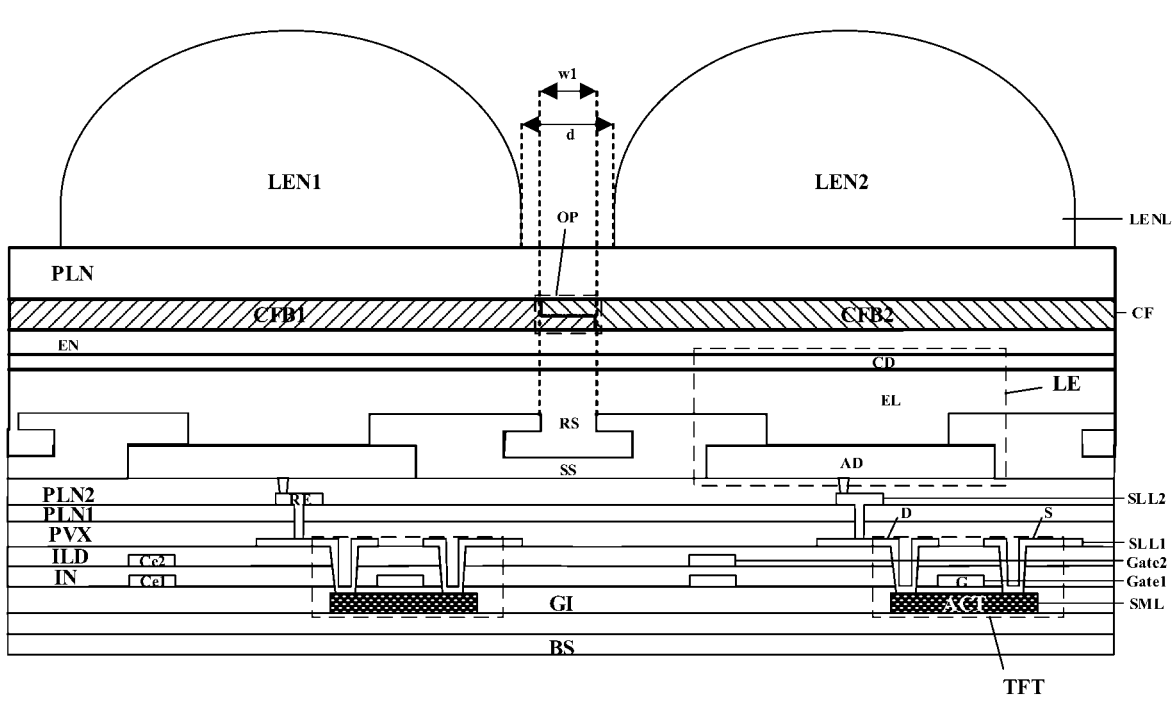
FIG. 32 is a cross-sectional view of a display panel in some embodiments according to the present disclosure.
Figure 33:
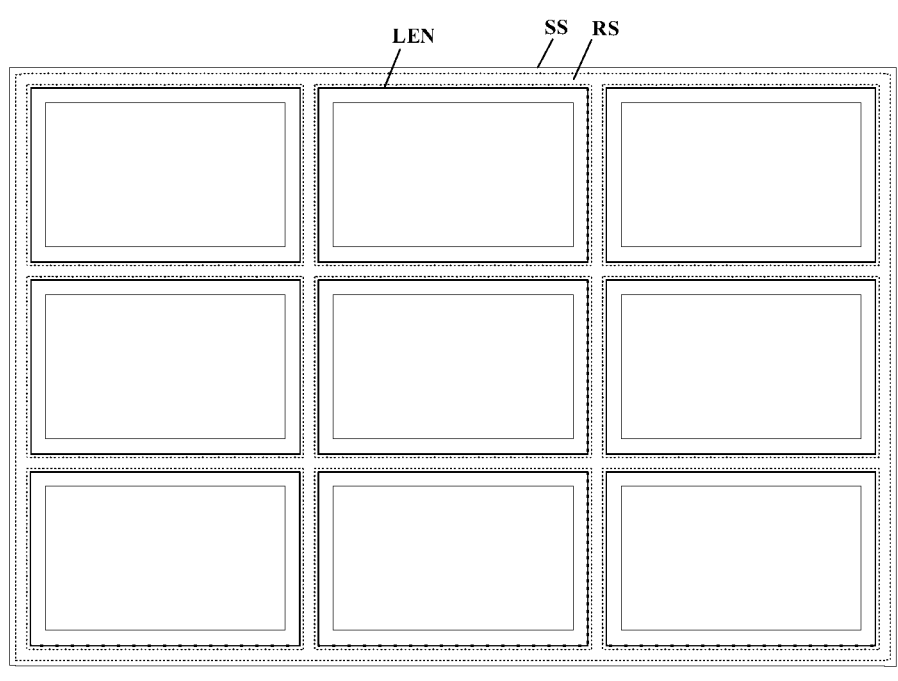
FIG. 33 is a plan view of a lens layer and a separation structure and a recess in some embodiments according to the present disclosure.

FIG. 32 is a cross-sectional view of a display panel in some embodiments according to the present disclosure. FIG. 33 is a plan view of a lens layer and a separation structure and a recess in some embodiments according to the present disclosure. Referring to FIG. 32 and FIG. 33, the lens layer includes a plurality of lenses LEN. In some embodiments, an orthographic projection of a respective lens of the plurality of lenses LEN on a base substrate BS partially overlaps with an orthographic projection of the separation structure SS on the base substrate BS. In some embodiments, the separation structure SS is a network continuously extending in a region between adjacent anodes of adjacent subpixels in the display panel. In the example depicted in FIG. 33, an orthographic projection of the plurality of lenses LEN on a base substrate is substantially non-overlapping (e.g., completely non-overlapping) with an orthographic projection of the recess RS on the base substrate.

In some embodiments, the display panel includes a recess RS extending into the separation structure SS. Optionally, referring to FIG. 33, the recess RS is a network continuously extending in an inter-subpixel region of the display panel.

Figure 34:
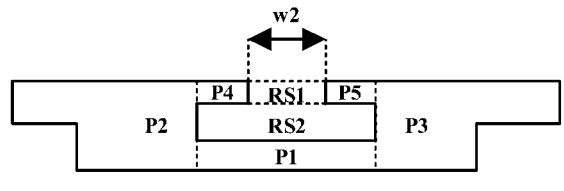
FIG. 34 is a cross-sectional view of a separation structure and a recess in some embodiments according to the present disclosure.

FIG. 34 is a cross-sectional view of a separation structure and a recess in some embodiments according to the present disclosure. Referring to FIG. 32 and FIG. 34, in a cross-section along a plane perpendicular to the base substrate BS and intersecting the separation structure SS and the plurality of lenses in a plurality of subpixels, the recess RS includes a first recess portion RS1 and a second recess portion RS2 connected with each other. The first recess portion RS1 is on a side of the second recess portion RS2 away from the base substrate BS. In the cross-section along the plane perpendicular to the base substrate BS and intersecting the separation structure SS and the plurality of lenses in a plurality of subpixels, the second recess portion RS2 has a width greater than a width of the first recess portion RS1.

Referring to FIG. 32 and FIG. 34, in a cross-section along a plane perpendicular to the base substrate BS and intersecting the separation structure SS and the plurality of lenses in a plurality of subpixels, the separation structure SS includes a first portion P1, a second portion P2, a third portion P3, a fourth portion P4, and a fifth portion P5. The first portion P1 connects the second portion P2 and the third portion P3. The second portion P2 connects the first portion P1 and the fourth portion P4. The third portion P3 connects the first portion P1 and the fifth portion P5. The second portion P2 and the third portion P3 are spaced apart by the second recess portion RS2. The fourth portion P4 and the fifth portion P5 are spaced apart by the first recess portion RS1.

In some embodiments, the second recess portion RS2 is surrounded by the first portion P1, the second portion P2, the third portion P3, the fourth portion P4, the fifth portion P5, and the first recess portion RS1. The first recess portion RS1 is partially surrounded by the fourth portion P4, the fifth portion P5, and the second recess portion RS2. The first recess portion RS1 spaces apart the fourth portion P4 and the fifth portion P5. The second recess portion RS2 spaces apart the second portion P2 and the third portion P3. The second recess portion RS2 spaces apart the first recess portion RS1 and the first portion P1.

In some embodiments, the display panel includes an organic material at least partially in the recess RS including the first recess portion RS1 and the second recess portion RS2. Optionally, the organic material is a residual organic material deposited during a process of forming a common layer using an open mask. Examples of common layers include a hole injection layer, a hole transport layer, an electron injection layer, and an electron transport layer. The separation structure SS at least partially segregates the common layer into discontinuous segments, thereby defining a plurality of subpixels.

In some embodiments, the separation structure SS includes an insulating material.

In some embodiments, in a cross-section along a plane perpendicular to the base substrate BS and intersecting the separation structure SS and the plurality of lenses in a plurality of subpixels, the recess RS has a 1 shape.

In some embodiments, the color filter CF includes an overlapping portion OP. In some embodiments, the overlapping portion OP includes a stacked structure comprising a portion of a first adjacent color filter block CFB1 and a portion of a second adjacent color filter block CFB2. In one example, the portion of the second adjacent color filter block CFB2 is on a side of the portion of the first adjacent color filter block CFB1 away from the base substrate BS. In another example, the portion of the first adjacent color filter block CFB1 is on a side of the portion of the second adjacent color filter block CFB2 away from the base substrate BS. In one example, the first adjacent color filter block CFB1 and the second adjacent color filter block CFB2 are color filter blocks of different colors. In another example, the first adjacent color filter block CFB1 and the second adjacent color filter block CFB2 are color filter blocks of a same color.

In some embodiments, an orthographic projection of the separation structure SS on a base substrate BS at least partially overlaps with an orthographic projection of the overlapping portion OP on the base substrate BS. Optionally, the orthographic projection of the separation structure SS on the base substrate BS covers the orthographic projection of the overlapping portion OP on the base substrate BS.

Figure 35:
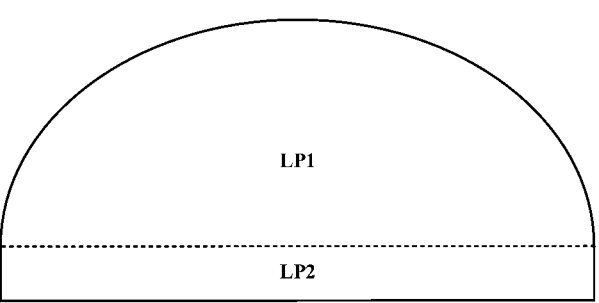
FIG. 35 is a cross-sectional view of a respective lens in some embodiments according to the present disclosure.

FIG. 35 is a cross-sectional view of a respective lens in some embodiments according to the present disclosure. Referring to FIG. 35, in some embodiments, the respective lens includes a first lens portion LP1 and a second lens portion LP2. The first lens portion LP1 has a partial spherical shape, and the second lens portion LP2 has a non-spherical shape, e.g., a shape lacking a spherical or partial spherical surface. In one example, the second lens portion LP2 has a cylindrical shape. In some embodiments, the second lens portion LP2 is on a side of the first lens portion LP1 closer to the base substrate BS. The first lens portion LP1 is on a side of the second lens portion LP2 away from the base substrate BS.

Figure 36:
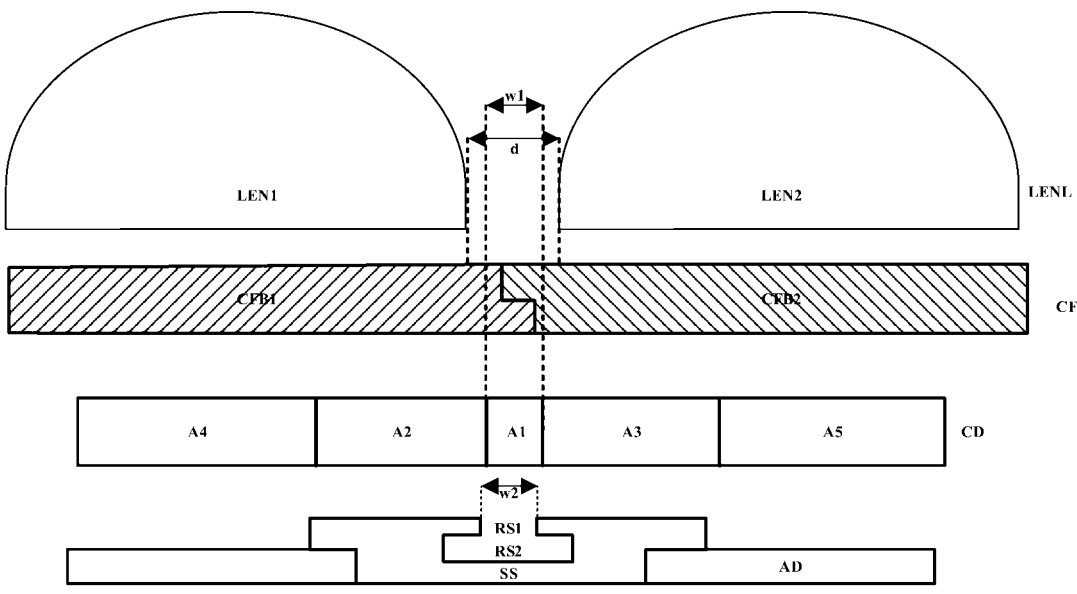
FIG. 36 illustrates a light path in a display panel in some embodiments according to the present disclosure.

FIG. 36 illustrates a light path in a display panel in some embodiments according to the present disclosure. The light path illustrated in FIG. 36 corresponds to a light path in a display panel having the structure depicted in FIG. 32. The components illustrated in FIG. 36 are schematic representations which may not have the actual shapes of the components. Referring to FIG. 36, the cathode CD has a first region A1, a second region A2, a third region A3, a fourth region A4, and a fifth region A5. The first region A1 corresponds to the first recess portion RS1. Because organic material layers (e.g., any common layer) are segregated due to the presence of the first recess portion RS1, any light emitting material deposited in the recess does not emit light. Accordingly, there is no light leakage in first region A1.

The fourth region A4 and the fifth region A5 correspond to normal light emitting regions of two adjacent subpixels, respectively.

Referring to FIG. 34 and FIG. 36, the second region A2 corresponds to the second portion P2 and the fourth portion P4 of the separation structure SS, the third region A3 corresponds to the third portion P3 and the fifth portion P5 of the separation structure SS. The organic material layers are deposited on the second portion P2, the third portion P3, the fourth portion P4, and the fifth portion P5. In regions corresponding to the second portion P2, the third portion P3, the fourth portion P4, and the fifth portion P5, the anode AD is either absent or spaced apart from the organic material layers by the separation structure SS. Due to horizontal current in the organic material layer, the second region A2 and the third region A3 are prone to light leakage.

Referring to FIG. 32, FIG. 34, and FIG. 36, in some embodiments, an orthographic projection of the second region A2 on a base substrate BS is at least partially non-overlapping with an orthographic projection of the lens layer LENL on the base substrate BS; and an orthographic projection of the third region A3 on the base substrate BS is at least partially non-overlapping with the orthographic projection of the lens layer LENL on the base substrate BS. Optionally, an orthographic projection of the first region A1 on the base substrate BS is non-overlapping with the orthographic projection of the lens layer LENL on the base substrate BS.

Referring to FIG. 32, FIG. 34, and FIG. 36, in some embodiments, an orthographic projection of the fourth portion P4 on a base substrate BS is at least partially non-overlapping with an orthographic projection of the lens layer LENL on the base substrate BS; and an orthographic projection of the fifth portion P5 on the base substrate BS is at least partially non-overlapping with the orthographic projection of the lens layer LENL on the base substrate BS. Optionally, an orthographic projection of the first recess portion RS1 on the base substrate BS is non-overlapping with the orthographic projection of the lens layer LENL on the base substrate BS.

The inventors of the present disclosure discover that, by having a non-spherical portion of the respective lens, light leakage and mura can be obviated. In particular, by having the non-spherical portion of the respective lens, when an alignment errors occurs in assembly the display panel, any light leakage in the inter-subpixel region is not prone to enter the respective lens (e.g., the first adjacent lens LEN1 or the second adjacent lens LEN2), thereby reducing crosstalk between adjacent subpixels and obviating mura.

Figures 37, 38:
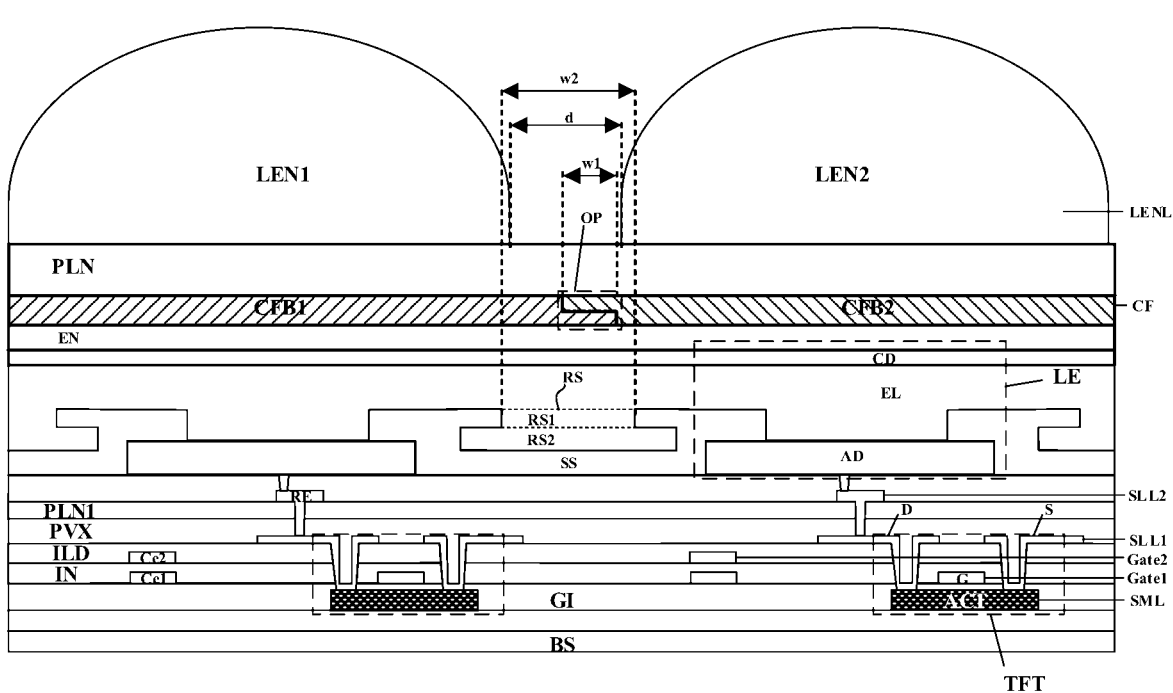
FIG. 37 is a cross-sectional view of a display panel in some embodiments according to the present disclosure.
FIG. 38 is a cross-sectional view of a display panel in some embodiments according to the present disclosure.

FIG. 37 is a cross-sectional view of a display panel in some embodiments according to the present disclosure. The display panel depicted in FIG. 37 has a structure similar to other examples described in the present disclosure (e.g., the display panel depicted in FIG. 7). The display panel depicted in FIG. 37 differs from the other examples described in the present disclosure in that the lenses and/or the color filter blocks are asymmetric with respect to the recess RS. Referring to FIG. 37, in some embodiments, an orthographic projection of a respective lens of the plurality of lenses LEN on a base substrate BS partially overlaps with an orthographic projection of the separation structure SS on the base substrate BS. Optionally, an orthographic projection of the plurality of lenses LEN on a base substrate BS is partially overlapping with an orthographic projection of the recess RS on the base substrate BS. Optionally, the orthographic projection of the separation structure SS on the base substrate BS covers the orthographic projection of the overlapping portion OP on the base substrate BS. Optionally, the orthographic projection of the recess RS on the base substrate BS covers the orthographic projection of the overlapping portion OP on the base substrate BS. In one example, the overlapping portion OP is limited in a region corresponding to the recess RS. Optionally, an orthographic projection of the plurality of lenses LEN on a base substrate BS is substantially non-overlapping (e.g., completely non-overlapping) with an orthographic projection of the overlapping portion OP on the base substrate BS. In some embodiments, d is greater than w1. In some embodiments, w2 is greater than d. In some embodiments, an orthographic projection of the first recess portion RS1 on the base substrate BS partially overlaps with the orthographic projection of the first adjacent lens LEN1 on the base substrate BS, and partially overlaps with the orthographic projection of the second adjacent lens LEN2 on the base substrate BS.

FIG. 38 is a cross-sectional view of a display panel in some embodiments according to the present disclosure. Referring to FIG. 38, in a cross-section along a plane perpendicular to the base substrate and intersecting the separation structure and the plurality of lenses in a plurality of subpixels, a first central line CL1 of the overlapping portion OP and a second central line CL2 of the first recess portion RS1 and/or the second recess portion RS2 are non-overlapping.

In some embodiments, in the cross-section along a plane perpendicular to the base substrate and intersecting the separation structure and the plurality of lenses in a plurality of subpixels, along a gap spacing apart the first adjacent lens LEN1 and the second adjacent lens LEN2, the first adjacent lens LEN1 has a first edge EG1, the second adjacent lens LEN2 has a second edge EG2. Optionally, a first shortest distance sd1 between the first edge EG1 and the second central line CL2 is greater than a second shortest distance sd2 between the second edge EG2 and the second central line CL2. Optionally, a third shortest distance sd3 between the first edge EG1 and the first central line CL1 is greater than a fourth shortest distance sd4 between the second edge EG2 and the first central line CL1. Optionally, the third shortest distance sd3 is greater than the first shortest distance sd1. Optionally, the second shortest distance sd2 is greater than the fourth shortest distance sd4.

As compared to other examples described in the present disclosure, in the display panel depicted in FIG. 37 and FIG. 38, the lenses and/or the color filter blocks are asymmetric with respect to the recess RS. Specifically, in the cross-section along a plane perpendicular to the base substrate and intersecting the separation structure and the plurality of lenses in a plurality of subpixels, the first adjacent lens LEN1 and the overlapping portion OP shift relative to each other along opposite direction with respect to the recess RS. The inventors of the present disclosure discover that the unique structure of the display panel is conducive to viewing angle adjustment in the display panel and/or customization of display panel having a particular viewing angle requirement.

In another aspect, the present disclosure provides a display apparatus including the display panel described herein or fabricated by a method described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a mini light emitting diode display apparatus. Optionally, the display apparatus is a micro light emitting diode display apparatus.

In another aspect, the present disclosure provides a method of fabricating a display panel. In some embodiments, the method includes forming a separation structure on a base substrate; forming a recess extending into the separation structure; forming a color filter comprising a plurality of color filter blocks on a side of the separation structure away from the base substrate; and forming a lens layer comprising a plurality of lenses on a side of the color filter away from the base substrate. Optionally, an orthographic projection of a respective lens of the plurality of lenses on the base substrate partially overlaps with an orthographic projection of the separation structure on the base substrate. Optionally, the recess comprises a first recess portion and a second recess portion connected with each other. Optionally, the first recess portion is on a side of the second recess portion away from the base substrate. Optionally, in plan view of the display panel, a gap between two adjacent lenses of the plurality of subpixels is in a region at least partially overlapping with a region having both the first recess portion and the second recess portion.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, comprising:

a base substrate;

a separation structure on the base substrate;

a recess extending into the separation structure;

a color filter comprising a plurality of color filter blocks on a side of the separation structure away from the base substrate; and a lens layer comprising a plurality of lenses on a side of the color filter away from the base substrate;

wherein an orthographic projection of a respective lens of the plurality of lenses on the base substrate partially overlaps with an orthographic projection of the separation structure on the base substrate;

the recess comprises a first recess portion and a second recess portion connected with each other;

the first recess portion is on a side of the second recess portion away from the base substrate; and in plan view of the display panel, a gap between two adjacent lenses of the plurality of subpixels is in a region at least partially overlapping with a region having both the first recess portion and the second recess portion;

wherein the color filter comprises an overlapping portion;

the overlapping portion comprises a stacked structure comprising a portion of a first adjacent color filter block and a portion of a second adjacent color filter block; and an orthographic projection of the plurality of lenses on the base substrate is non-overlapping with an orthographic projection of the overlapping portion on the base substrate.

2. The display panel of claim 1, wherein, in the cross-section along the plane perpendicular to the base substrate and intersecting the separation structure and the plurality of lenses in a plurality of subpixels, a first adjacent lens and a second adjacent lens of the plurality of lenses are spaced apart from each other by a distance less than the width of the first recess portion.

3. The display panel of claim 1, wherein the separation structure comprises a first portion, a second portion, a third portion, a fourth portion, and a fifth portion;

the first portion connects the second portion and the third portion;

the second portion connects the first portion and the fourth portion;

the third portion connects the first portion and the fifth portion;

the second portion and the third portion are spaced apart by the second recess portion; and the fourth portion and the fifth portion are spaced apart by the first recess portion.

4. The display panel of claim 3, wherein an orthographic projection of a first adjacent lens of the plurality of lenses on the base substrate covers an orthographic projection of the fourth portion on the base substrate; and an orthographic projection of a second adjacent lens of the plurality of lenses on the base substrate covers an orthographic projection of the fifth portion on the base substrate.

5. The display panel of claim 3, wherein a part of the first portion in a region having the first recess portion protrudes toward the first recess portion;

the first portion has a non-uniform thickness;

a center part of the first portion has a thickness greater than a thickness of a peripheral part of the first portion; and the protrusion of the first portion comprises a residual organic material deposited during a process of forming a common layer using an open mask.

6. The display panel of claim 1, wherein, in the cross-section along the plane perpendicular to the base substrate and intersecting the separation structure and the plurality of lenses in a plurality of subpixels, the first recess portion has a rectangular shape, and the second recess portion has a rectangular shape.

7. The display panel of claim 1, wherein the orthographic projection of the separation structure on the base substrate at least partially overlaps with an orthographic projection of the overlapping portion on the base substrate.

8. The display panel of claim 7, wherein the orthographic projection of the separation structure on the base substrate covers the orthographic projection of the overlapping portion on the base substrate.

9. The display panel of claim 3, wherein an orthographic projection of the fourth portion on the base substrate is partially non-overlapping with an orthographic projection of a first adjacent lens of the plurality of lenses on the base substrate; and an orthographic projection of the fifth portion on the base substrate is partially non-overlapping with an orthographic projection of a second adjacent lens of the plurality of lenses on the base substrate.

10. A display panel, comprising:

a base substrate;

a separation structure on the base substrate;

a recess extending into the separation structure;

a color filter comprising a plurality of color filter blocks on a side of the separation structure away from the base substrate; and a lens layer comprising a plurality of lenses on a side of the color filter away from the base substrate;

wherein an orthographic projection of a respective lens of the plurality of lenses on the base substrate partially overlaps with an orthographic projection of the separation structure on the base substrate;

the recess comprises a first recess portion and a second recess portion connected with each other;

the first recess portion is on a side of the second recess portion away from the base substrate; and in plan view of the display panel, a gap between two adjacent lenses of the plurality of subpixels is in a region at least partially overlapping with a region having both the first recess portion and the second recess portion;

wherein the color filter comprises an overlapping portion;

the overlapping portion comprises a stacked structure comprising a portion of a first adjacent color filter block and a portion of a second adjacent color filter block; and in the cross-section along the plane perpendicular to the base substrate and intersecting the separation structure and the plurality of lenses in a plurality of subpixels, the overlapping portion has a first width, a first adjacent lens and a second adjacent lens of the plurality of lenses are spaced apart from each other by a distance greater than the first width.

11. The display panel of claim 10, wherein the width of the first recess portion is greater than the distance.

12. A display apparatus, comprising the display panel of claim 1, and one or more integrated circuits connected to the display panel.

13. The display panel of claim 3, wherein, in the cross-section along the plane perpendicular to the base substrate and intersecting the separation structure and the plurality of lenses in a plurality of subpixels, the fourth portion has a non-rectangular shape, and the fifth portion has non-a rectangular shape.

14. The display panel of claim 13, wherein a shape of the fourth portion comprises a rectangular portion and a triangular portion connected together, the triangular portion being on a side of the rectangular portion away from the second portion, the rectangular portion connecting the triangular portion to the second portion; and a shape of the fifth portion comprises a rectangular portion and a triangular portion connected together, the triangular portion being on a side of the rectangular portion away from the third portion, the rectangular portion connecting the triangular portion to the third portion.

15. The display panel of claim 13, wherein a shape of the fourth portion comprises a first rectangular portion and a second rectangular portion connected together, the second rectangular portion being on a side of the first rectangular portion away from the second portion, the first rectangular portion connecting the second rectangular portion to the second portion; and a shape of the fifth portion comprises a first rectangular portion and a second rectangular portion connected together, the second rectangular portion being on a side of the first rectangular portion away from the third portion, the first rectangular portion connecting the second rectangular portion to the third portion.

16. A display panel, comprising:

a base substrate;

a separation structure on the base substrate;

a recess extending into the separation structure;

a color filter comprising a plurality of color filter blocks on a side of the separation structure away from the base substrate; and a lens layer comprising a plurality of lenses on a side of the color filter away from the base substrate;

wherein an orthographic projection of a respective lens of the plurality of lenses on the base substrate partially overlaps with an orthographic projection of the separation structure on the base substrate;

the recess comprises a first recess portion and a second recess portion connected with each other;

the first recess portion is on a side of the second recess portion away from the base substrate; and in plan view of the display panel, a gap between two adjacent lenses of the plurality of subpixels is in a region at least partially overlapping with a region having both the first recess portion and the second recess portion;

wherein, in the cross-section along the plane perpendicular to the base substrate and intersecting the separation structure and the plurality of lenses in a plurality of subpixels, a first adjacent lens and a second adjacent lens of the plurality of lenses are spaced apart from each other by a distance greater than the width of the first recess portion.

17. The display panel of claim 16, wherein the color filter comprises an overlapping portion;

the overlapping portion comprises a stacked structure comprising a portion of a first adjacent color filter block and a portion of a second adjacent color filter block;

in the cross-section along the plane perpendicular to the base substrate and intersecting the separation structure and the plurality of lenses in a plurality of subpixels, the overlapping portion has a first width less than the distance.

18. The display panel of claim 1, wherein, in a cross-section along a plane perpendicular to the base substrate and intersecting the separation structure and the plurality of lenses in a plurality of subpixels, a first central line of the overlapping portion and a second central line of the first recess portion and/or the second recess portion are non-overlapping.

19. The display panel of claim 18, wherein, in the cross-section along a plane perpendicular to the base substrate and intersecting the separation structure and the plurality of lenses in a plurality of subpixels, along a gap spacing apart the first adjacent lens and the second adjacent lens, the first adjacent lens has a first edge, the second adjacent lens has a second edge;

a first shortest distance between the first edge and the second central line is greater than a second shortest distance between the second edge and the second central line;

a third shortest distance between the first edge and the first central line is greater than a fourth shortest distance between the second edge and the first central line;

the third shortest distance is greater than the first shortest distance; and the second shortest distance is greater than the fourth shortest distance.

* * * * *